US007594066B2

(12) United States Patent
Watanabe et al.

(10) Patent No.: US 7,594,066 B2
(45) Date of Patent: Sep. 22, 2009

(54) STORAGE SYSTEM COMPRISING NON-VOLATILE MEMORY DEVICES WITH INTERNAL AND EXTERNAL REFRESH PROCESSING

(75) Inventors: Yasuo Watanabe, Kawasaki (JP); Yoshiaki Eguchi, Yokohama (JP); Shunji Kawamura, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 492 days.

(21) Appl. No.: 11/498,870

(22) Filed: Aug. 4, 2006

(65) Prior Publication Data
US 2008/0005456 A1 Jan. 3, 2008

(30) Foreign Application Priority Data
Jun. 14, 2006 (JP) ............................. 2006-164236

(51) Int. Cl.
*G06F 12/00* (2006.01)
(52) U.S. Cl. .................... 711/103; 711/105; 365/185.01
(58) Field of Classification Search ................. 711/103, 711/105; 365/185.01
See application file for complete search history.

(56) References Cited
U.S. PATENT DOCUMENTS
5,365,486 A * 11/1994 Schreck ................. 365/185.22

| | | | | |
|---|---|---|---|---|
| 6,240,032 B1 * | 5/2001 | Fukumoto | ................... | 365/222 |
| 7,079,422 B1 * | 7/2006 | Wong | ................... | 365/185.25 |
| 7,103,737 B1 * | 9/2006 | Kekre et al. | ................. | 711/161 |
| 2003/0167327 A1 * | 9/2003 | Baldwin et al. | ............. | 709/225 |
| 2005/0243626 A1 | 11/2005 | Ronen | | |

OTHER PUBLICATIONS
U.S. Appl. No. 60/566,840, filed Apr. 29, 2004, Ronen.

* cited by examiner

*Primary Examiner*—Brian R Peugh
*Assistant Examiner*—Hashem Farrokh
(74) *Attorney, Agent, or Firm*—Antonelli, Terry, Stout & Kraus, LLP.

(57) ABSTRACT

The storage system of the present invention preserves data long-term by using memory devices such as flash memory devices. A flash memory mounting unit of a storage apparatus has a plurality of flash memory devices. Logical devices are set up in the storage region of the flash memory devices. A start-up scheduler controls start-up of internal refresh processing and external refresh processing. A refresh function management table respectively manages the method of refreshing the data stored in the flash memory devices and the refresh time, for each logical device. The start-up scheduler, on discovering that a logical device has reached its refresh period, sends a start-up command to the storage apparatus or external apparatus, to start-up internal refresh processing or external refresh processing.

10 Claims, 23 Drawing Sheets

| FM CONTROLLER REFRESH FUNCTION INFORMATION | MT3 |
|---|---|
| FM_CTL IDENTIFICATION INFORMATION | WHETHER A REFRESH FUNCTION IS PROVIDED OR NOT |
| FM_CTL #1 | YES |
| FM_CTL #2 | YES |
| FM_CTL #3 | NO |

FIG. 15

| LUN# | LU | | VDEV | | | |
|---|---|---|---|---|---|---|
| | # | MAX SLOT NO. | # | MAX SLOT NO. | DEVICE TYPE | PATH INFORMATION |
| 1 | 1 | 10000 | 1 | 50000 | FM | INTERNAL PATH INFORMATION |
| 2 | 2 | 40000 | | | | |
| 3 | 3 | 50000 | 2 | 50000 | FM | WWN,LUN |
| 4 | 4 | 50000 | 3 | 50000 | FM | WWN,LUN |

MAPPING TABLE — MT4

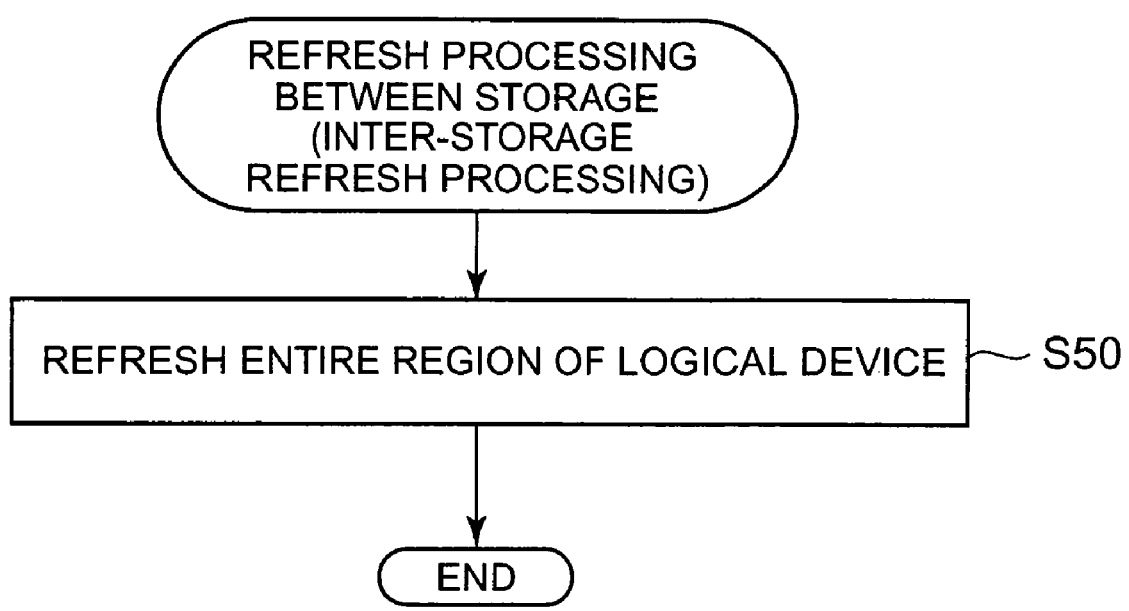

FIG. 19

REFRESH FUNCTION MANAGEMENT TABLE — MT1A

| LOGICAL DEVICE INFORMATION | REFRESH FUNCTION INFORMATION | TIME INFORMATION (REFRESH TIME ON PREVIOUS OCCASION, START-UP TIME ON NEXT OCCASION) | WHETHER REFRESHING IS REQUIRED |
|---|---|---|---|
| WWN1, LU#1 | INTERNAL REFRESH FUNCTION: YES IP ADDRESS 1 | T1, T2 | REFRESHING REQUIRED |
| WWN2, LU#2 | EXTERNAL REFRESH FUNCTION: YES IP ADDRESS 2 | T3, T4 | REFRESHING NOT REQUIRED |
| ⋮ | ⋮ | ⋮ | ⋮ |

STORAGE SYSTEM COMPRISING NON-VOLATILE MEMORY DEVICES WITH INTERNAL AND EXTERNAL REFRESH PROCESSING

CROSS REFERENCE TO RELATED APPLICATIONS

This application relates to and claims priority from Japanese Patent Application No. 2006-164236 filed on Jun. 14, 2006, the entire disclosure of which is incorporated herein by reference.

BACKGROUND OF THE INVENTION

The present invention relates to a storage system employing a rewritable nonvolatile memory device.

In organizations such as enterprises, in order to manage large quantities of data, a storage apparatus is employed that is separately constructed from the host computer (hereinbelow referred to as "host"). For example, in organizations such as financial organizations or hospitals, it is necessary to store for example trading data relating to a large number of customers or diagnostic data over a long period, so storage devices of high reliability and large capacity are required. As such storage apparatus satisfying both requirements for high reliability and high capacity, for example a host may be provided with a logical storage region using a RAID (redundant array of independent disks) in which a large number of hard disk drives are connected in array fashion.

The amount of data to be managed long-term by enterprises etc increases daily. Consequently, the number of hard disk drives mounted in a storage apparatus continues to increase. In a hard disk, as is well known, reading of data is achieved by causing a magnetic head to perform seeking while rotating the magnetic disk at high speed using a spindle motor. The external dimensions and weight and also the power consumption of a hard disk drive are therefore larger than in the case of a storage apparatus such as semiconductor memory.

As the storage capacity of a storage apparatus is made larger, the number of hard disk drives mounted therein increases. Consequently, the installation area of the storage apparatus increases, and the power consumption of the storage apparatus becomes large. The cost of introduction and the cost of maintenance of the storage apparatus therefore increase, tending to raise the total cost of ownership (TCO).

In recent years, a new type of a storage device called a flash memory device has attracted attention. Comparing a flash memory device and a hard disk drive, the flash memory device has lower power consumption and a faster speed of reading data. Also, since flash memory devices do not need mechanical moving parts, they can be formed of smaller size than hard disk drives, and have the property that failure is unlikely to occur.

Flash memory devices are rewritable nonvolatile memories capable of continuing to hold data for a comparatively long period. However, in flash memory devices also, due to the gradual change in the voltages held in the memory cells due to leakage current, if the flash memory device is left undisturbed for a long period, there is a possibility that it will before long become impossible to read data from the memory cells.

Accordingly, the technique has been proposed of refreshing data stored in a flash memory device by writing the data back to its original location after first reading the data stored in a flash memory device (specification of Laid-open US Patent Application No. 2005/0243626).

The prior art set out in the above reference aims to achieve long-term storage of data by refreshing of data in a flash memory device. However, the prior art set out in the above reference aims solely at refreshing unit flash memory devices and no consideration is given to a storage apparatus comprising a large number of storage devices. The prior art set out in the above reference cannot therefore be directly applied to a storage apparatus.

As described above, it is necessary that a storage apparatus should continue to hold important data for a period ranging from some years to some tens of years. Consequently, in contrast to home-use products such as for example music players using flash memory devices, an extremely high level of reliability over a long period is required. Also, as described above, a storage apparatus requires a large number of storage devices for managing large quantities of data. A mechanism for using a large number of flash memory devices in an efficient and stable fashion is therefore required.

The memory capacity required by a storage system increases as the amount of data to be managed increases. In order to increase the storage capacity of a storage system, a storage system may therefore comprise a plurality of storage apparatuses. A storage system may therefore include an assortment of storage apparatus of respectively different specifications and it is necessary to preserve important data for a long period in a heterogeneous environment.

The case may therefore be envisioned in which although a certain storage apparatus has a data refresh function, other storage apparatus does not have a refresh function. Also, even in the case of memory devices mounted in the same storage apparatus, the case may be envisioned in which some memory devices incorporate a refresh function whereas other memory devices do not have a refresh function.

In storage systems comprising a plurality of storage apparatuses respectively constructed by large and complex system products, increased storage capacity combined with high reliability permitting no loss of data are demanded, and also ceaseless operation (24 hours a day and 365 days a year) is sought. Since storage systems comprising a storage apparatus have these technical features, the performance and reliability required by the market cannot be satisfied simply by applying the prior art set out in the reference given above.

SUMMARY OF THE INVENTION

Accordingly, an object of the present invention is to provide a storage system using rewritable nonvolatile memory devices, wherein data can be preserved long-term by refreshing the data stored on the memory devices by a suitable method at suitable times. A further object of the present invention is to provide a storage system wherein refreshing of data stored on rewritable nonvolatile memory devices can be executed in a manner responsive to the construction of the storage system. Further objects of the present invention will become clear from the following description of embodiments.

In order to solve the above problems, in a storage system according to one aspect of the present invention comprising: an external apparatus; a storage apparatus connected through a communication network with this external apparatus; and a management unit that manages the external apparatus and the storage apparatus, the storage apparatus comprises: a storage unit having rewritable nonvolatile memory devices; and a controller that controls this storage unit; and provides to the external apparatus a plurality of logical devices based on storage regions possessed by the memory devices; the management unit respectively manages refresh times for each of the logical devices and, when detected that a prescribed logical device of the logical devices has reached its refresh time, selects one refresh mode of a plurality of types of refresh mode, and executes this selected refresh mode in respect of the prescribed logical device.

In an embodiment of the present invention, the plurality of types of refresh mode include an external refresh mode and internal refresh mode; in the external refresh mode, the external apparatus reads all of the data stored in the prescribed logical device through the storage apparatus, and writes back all of the data that has been read to the prescribed logical device through the storage apparatus; in the internal refresh mode, within the storage apparatus, all of the data stored in the prescribed logical device is read and all of the data that is thus read is written back to the prescribed logical device.

In an embodiment of the present invention, the plurality of types of refresh mode include a first internal refresh mode and a second internal refresh mode; in the first internal refresh mode, the controller reads all of the data stored on a prescribed logical device, and writes back all of the data that has been read to the prescribed logical device; and in the second internal refresh mode, within the memory device all of the data stored in a prescribed storage region corresponding to the prescribed logical device, of storage regions of the memory device, is read and all of this data that is thus read is written back to the prescribed storage region.

In an embodiment of the present invention, the plurality of types of refresh mode include an external refresh mode, a first internal refresh mode, and a second internal refresh mode; in the external refresh mode, the external apparatus reads all of the data stored in the prescribed logical device through the storage apparatus, and writes back all of the data that has been read to the prescribed logical device through the storage apparatus; in the first internal refresh mode, the controller reads all of the data stored on a prescribed logical device, and writes back all of the data that has been read to the prescribed logical device; and in the second internal refresh mode, within the memory device all of the data stored in a prescribed storage region corresponding to the prescribed logical device, of storage regions of the memory device, is read and all of this data that is thus read is written back to the prescribed storage region.

In an embodiment of the present invention, the management unit issues to one of the external apparatus or storage apparatus a command for requesting execution of the selected refresh mode, by utilizing a management table that respectively manages for each logical device information indicating which refresh mode of the plurality of types of refresh mode is to be selected and information indicating the refresh time.

In an embodiment of the present invention, the storage apparatus, when a command is received from the management unit, determines whether refresh relating to the prescribed logical device is to be executed by the controller or whether refresh relating to the prescribed logical device is to be executed in a memory device.

In an embodiment of the present invention, the external apparatus, when a command is received from the management unit, reads all the data stored in the prescribed logical device through the storage apparatus and writes back all of this data that has been read to the prescribed logical device through the storage apparatus.

In an embodiment of the present invention, an order of priority is set beforehand in respect of the plurality of types of refresh mode and the management unit selects with priority a refresh mode of high order of priority.

In an embodiment of the present invention, the management unit, when both an external refresh mode and internal refresh mode can be selected, selects with priority the internal refresh mode.

In an embodiment of the present invention, the management unit, when a plurality of prescribed logical devices are present, performs adjustment such that the refresh times relating to these prescribed logical devices do not overlap.

In an embodiment of the present invention, the management unit alters the refresh time relating to the prescribed logical device if prescribed processing to write all of the data stored on the prescribed logical device to a memory device has been performed previously, prior to the arrival of the refresh time in respect of the prescribed logical device.

In this embodiment, the management unit is provided within the external apparatus. It is also possible to provide the management unit within the storage apparatus. The management unit could also be constituted as an independent computer apparatus separate from the external apparatus and storage apparatus.

The external apparatus could be constituted as a storage apparatus separate from the above storage apparatus. In addition, the external apparatus may comprise a virtual logical device to which a logical device possessed by the storage apparatus is allocated.

The external apparatus may be constituted as a host device that reads/writes data in respect of a logical device possessed by the storage apparatus. The external apparatus may also be constituted as a switch apparatus connected to the storage apparatus.

When the refresh time arrives, the storage apparatus may be connected to the external apparatus through a communication network.

In a storage system according to another aspect of the present invention comprising: an external apparatus and a storage apparatus mutually connected through a first communication network; and a management unit respectively connected to the external apparatus and storage apparatus through a second communication network separate from the first communication network, the storage apparatus comprises: a storage unit having rewritable nonvolatile memory devices; a controller that controls this storage unit; a plurality of logical devices based on storage regions possessed by the memory devices; and an internal refresh processing unit for performing refresh relating to the logical devices; the external apparatus comprises: an external refresh processing unit for performing refresh relating to the logical devices through the storage apparatus; and the management apparatus comprises a management table that respectively manages beforehand for each logical device the refresh time and information indicating which of internal refresh processing or external refresh processing is to be selected; and a starting up unit that issues to the storage apparatus or external apparatus a command for starting up refresh processing of the selected one of internal refresh processing or external refresh processing.

The constituent elements of the present invention may be constituted in whole or in part as a computer program. This computer program may be fixed on a recording medium and for example transferred, and, in addition, may be transmitted through a communication network such as the Internet.

BRIEF DESCRIPTION OF THE DRAWINGS

FIG. 15 is a diagram showing a mapping table;

FIG. 18 is a flow chart showing refresh processing between storage (inter-storage refresh processing);

FIG. 19 is a diagram showing a refresh function management table employed in a storage system according to a third embodiment;

DESCRIPTION OF THE PREFERRED EMBODIMENTS

Figure 1:
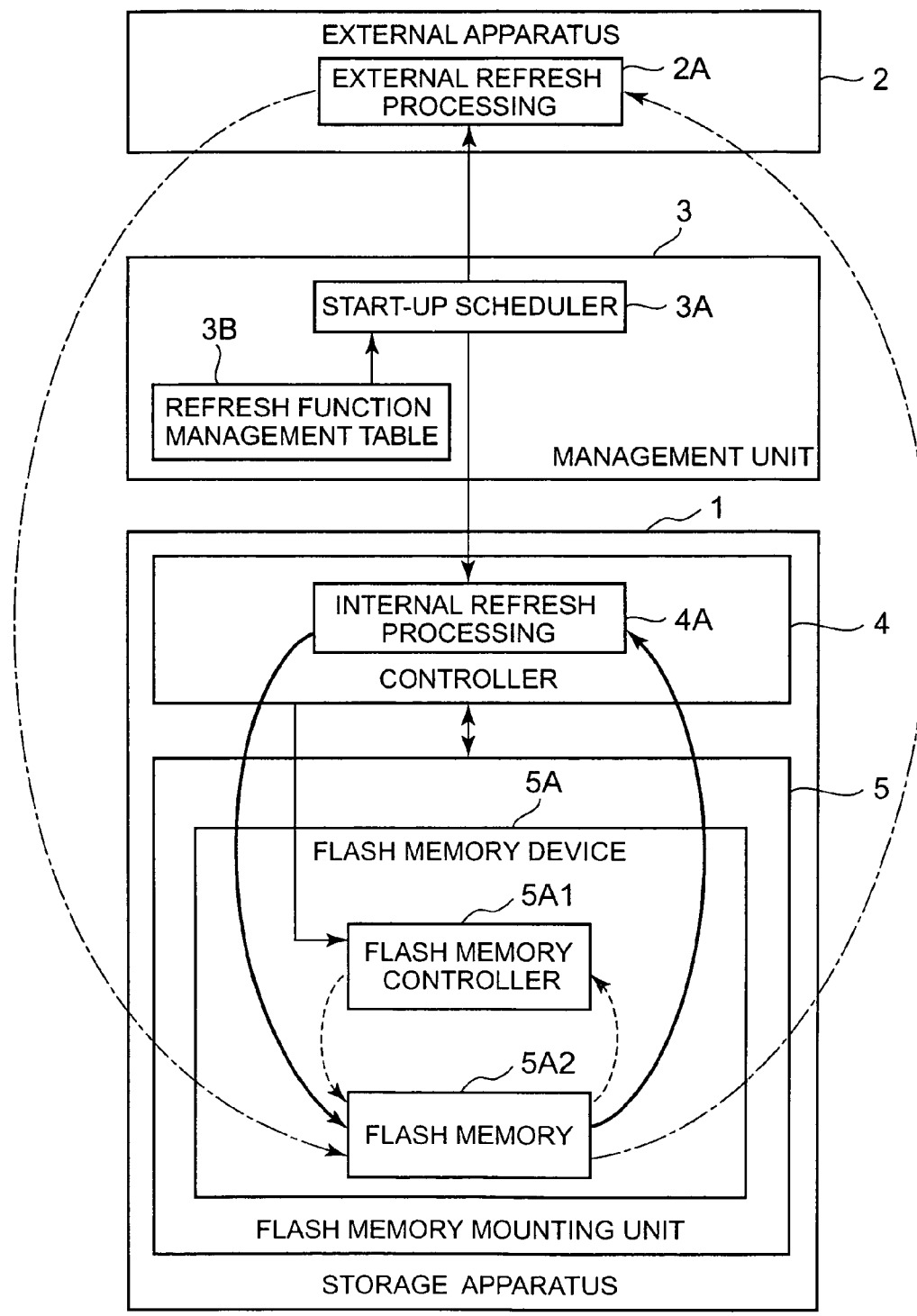
FIG. 1 is a diagram showing conceptually an embodiment of the present invention.

Embodiments of the present invention are described below with reference to the drawings. FIG. 1 is a diagram showing the overall concept of an embodiment of the present invention. The storage system of the present embodiment comprises for example a storage apparatus 1, external apparatus 2 and a management unit 3.

The storage apparatus 1 comprises a controller 4 and a flash memory mounting unit 5. The controller 4 performs control of the operation of the storage apparatus 1 and is responsible for data communication with the flash memory mounting unit 5 and data communication with the external apparatus 2, for example. Also, the controller 4 is capable of executing internal refresh processing 4A, to be described.

The flash memory mounting unit 5 corresponds to the "storage unit". The flash memory mounting unit 5 comprises a plurality of flash memory devices 5A. In FIG. 1, only a single flash memory device 5A is shown. The flash memory device 5A may comprise for example a flash memory controller 5A1, and flash memory 5A2. As the flash memory 5A2, there may be suitably employed for example NAND type flash memory or NOR type flash memory. The flash memory controller 5A1 performs for example writing of data or reading the data to or from the flash memory 5A2.

One or a plurality of logical storage regions may be generated based on the physical storage regions possessed by one or a plurality of flash memory devices 5A. These logical storage regions are termed logical devices or logical volumes.

The external apparatus 2 is computer apparatus provided outside the storage apparatus 1. As will become clear from the embodiments described below, examples that may be given of the external apparatus 2 include a host such as a server computer, other storage apparatus or switching apparatus. The external apparatus 2 is capable of executing external refresh processing, to be described. The external apparatus 2 can perform reading of data by accessing a logical device provided in the storage apparatus 1.

The management unit 3 serves to manage refreshing of data stored on the flash memory device 5A. The management unit 3 is constituted comprising for example a start-up scheduler 3A and refresh function management table 3B. As is clear from the embodiments to be described, the management unit 3 may be constituted as independent computer apparatus separate from the storage apparatus 1 and external apparatus 2, or may be constituted as a function incorporated in the storage apparatus 1 or external apparatus 2.

The start-up scheduler 3A controls the start-up of the refresh processing (internal refresh processing 4A, external refresh processing 2A) provided by the storage system. The refresh function management table 3B respectively manages the refresh method and refresh time of the data stored on the refresh memory device 5A, for each logical device. When the start-up scheduler 3 A discovers a logical device whose refresh period has arrived, it sends a start-up command to one of the storage apparatus 1 or external apparatus 2, in accordance with the method that is pre-set in respect of this logical device. In this way, only one of the internal refresh processing 4A or external refresh processing 2A is started up.

Next, the type of refresh methods will be described. In this embodiment, as described below, of the plurality of types of refresh method (refresh modes), a single refresh method is selected and executed in accordance with for example the construction or load of the storage system.

The plurality of refresh modes that are provided by a storage system according to the present embodiment may be roughly divided into external refresh mode and internal refresh mode. External refresh mode is a mode in which the data that is stored on the flash memory device 5A is refreshed outside the storage apparatus 1. The internal refresh mode is a mode in which the data that is stored on the refresh memory device 5A is refreshed within the storage apparatus 1. In this embodiment, the internal refresh mode is set to a higher priority than the external refresh mode, taking into account the load of the storage system. That is, when the internal refresh mode is capable of being utilized, the internal refresh mode is set with priority.

The internal refresh mode is further classified into first internal refresh mode and second internal refresh mode. The first internal refresh mode is a refresh mode that is executed in the storage apparatus 1 under the control of the controller 4 of the storage apparatus 1. The second internal refresh mode is a refresh mode that is executed within the flash memory device 5A under the control of the flash memory controller 5A1 in the flash memory device 5A.

The external refresh mode will now be described. When a command issued from the start-up scheduler 3A of the management unit 3 is received by the external apparatus 2, the external refresh processing 2A is started up. As indicated by the single dotted chain line in FIG. 1, in the external refresh processing 2A, the flash memory device 5A corresponding to the logical device that is the subject of refreshing is accessed through the storage apparatus 1 and the data thereof is read. This data which has been read is stored in the memory of the external apparatus 2. In the external refresh processing 2A, the data that was temporarily stored in the external apparatus 2 is then written to its original position in the flash memory device 5A that was the source of data reading. In this way, the voltage values of the cells of the flash memory 5A2 are restored in accordance with the type of data (1 or 0) stored in the cell in question.

The internal refresh mode will now be described. When the start-up scheduler 3A issues a start-up command to the storage apparatus 1, the internal refresh processing 4A is started up. The internal refresh processing 4A determines which of the first internal refresh mode or second internal refresh mode is executed.

For example, if the flash memory device 5A comprises a refresh function, the internal refresh processing 4A selects the first internal refresh mode. If the first internal refresh mode is selected, as shown by the thick line in FIG. 1, the controller 4 accesses the flash memory device 5A corresponding to the logical device that is the subject of refreshing, and reads the data therein. This data that is thus read is temporarily stored in memory in the controller 4. The controller 4 then writes this data that has been read to the flash memory device 5A at its original position.

If the second internal refresh mode is selected, as shown by the dotted line in FIG. 1, the flash memory controller 5A1, in accordance with instructions from the internal refresh processing 4A, reads data of a prescribed size from a prescribed position of the flash memory 5A2. This data which has been read is written to for example a free region in the flash memory 5A2 to that was originally read, or a storage region of another unused flash memory 5A2. The flash memory controller 5A1 then writes this data that has been read to the flash memory 5A2 at its original position.

In this embodiment constructed in this way, rewritable nonvolatile memory is employed as the storage device, so, compared with the use of a hard disk drive, power consumption can be reduced and the storage apparatus 1 can be reduced in size. Consequently, the introduction cost and maintenance cost of the storage apparatus 1 can be reduced.

In this embodiment, refreshing of the data that is stored on the flash memory device 5A is performed using one refresh mode of the plurality of types of refresh mode. Consequently, even if the data is preserved on the flash memory device 5A for a long period, it is possible to prevent the data stored in the memory-cells from becoming unreadable due to change of the voltage values of the memory cells of the flash memory device 5A.

In this embodiment, refreshing of the data is executed in logical device units. That is, refreshing of the data can be performed in the units that are recognized and utilized by the external apparatus 2, such as a host. In this way, for example efficient and appropriate management of archive volumes that require to be preserved for a long period can be achieved.

In this embodiment, there are provided a plurality of types of refresh mode including an external refresh mode wherein data is refreshed outside the storage apparatus 1 and an internal refresh mode in which data is refreshed within the storage apparatus 1 and any one of these refresh modes can be selected. Consequently, ease of use is improved, since for example the most suitable refresh mode can be selected in accordance with the construction of the storage system or the type of logical device.

For example, if the flash memory device 5A is provided with a refresh function, the data in the flash memory device 5A can be refreshed without increasing the load on the controller 4 or external apparatus 2, by means of the second internal refresh mode. Also, if for example the flash memory device 5A is not provided with a refresh function or if the external apparatus 2 has no refresh function, refreshing of the data in the storage apparatus 1 can be achieved by the first internal refresh mode without increasing the load of the external apparatus 2. Furthermore, even if for example the controller 4 of the storage apparatus 1 has no refresh function, the data in the flash memory device 5A can be refreshed by utilizing the refresh function of the external apparatus 2.

Consequently, in this embodiment, even in the case where there is an assortment of flash memory devices 5A, storage apparatus 1 and external apparatus 2 having respectively different specifications in regard to the data refresh function, the data in the flash memory 5A can be refreshed and the data can therefore be preserved over a long period of time.

In this embodiment, when both the external refresh mode and internal refresh mode can be utilized, the internal refresh mode is selected with priority. In this way, the processing load of the external apparatus 2 can be lowered, and refreshing of data can be achieved without affecting other processing executed by the external apparatus 2. Also, when the internal refresh mode is selected, the data that is the subject of being refreshed is not transferred between the storage apparatus 1 and external apparatus 2, so increase in traffic between the storage apparatus 1 and external apparatus 2 can be prevented.

In this embodiment, when both the first internal refresh mode and second internal refresh mode are capable of being used, the second internal refresh mode is selected with priority. In this way, the processing load of the controller 4 can be reduced and data refresh can be performed without lowering the response performance of the storage apparatus 1.

It should be noted that, although the case has been described in which one of the refresh modes of the plurality of types of refresh mode was selected and executed, there is no restriction to this, and it would be possible to execute the plurality of refresh modes at different periods. For example, the first internal refresh mode or external refresh mode could be executed after executing the second internal refresh mode. This embodiment is described below in detail.

Embodiment 1

Figure 2:
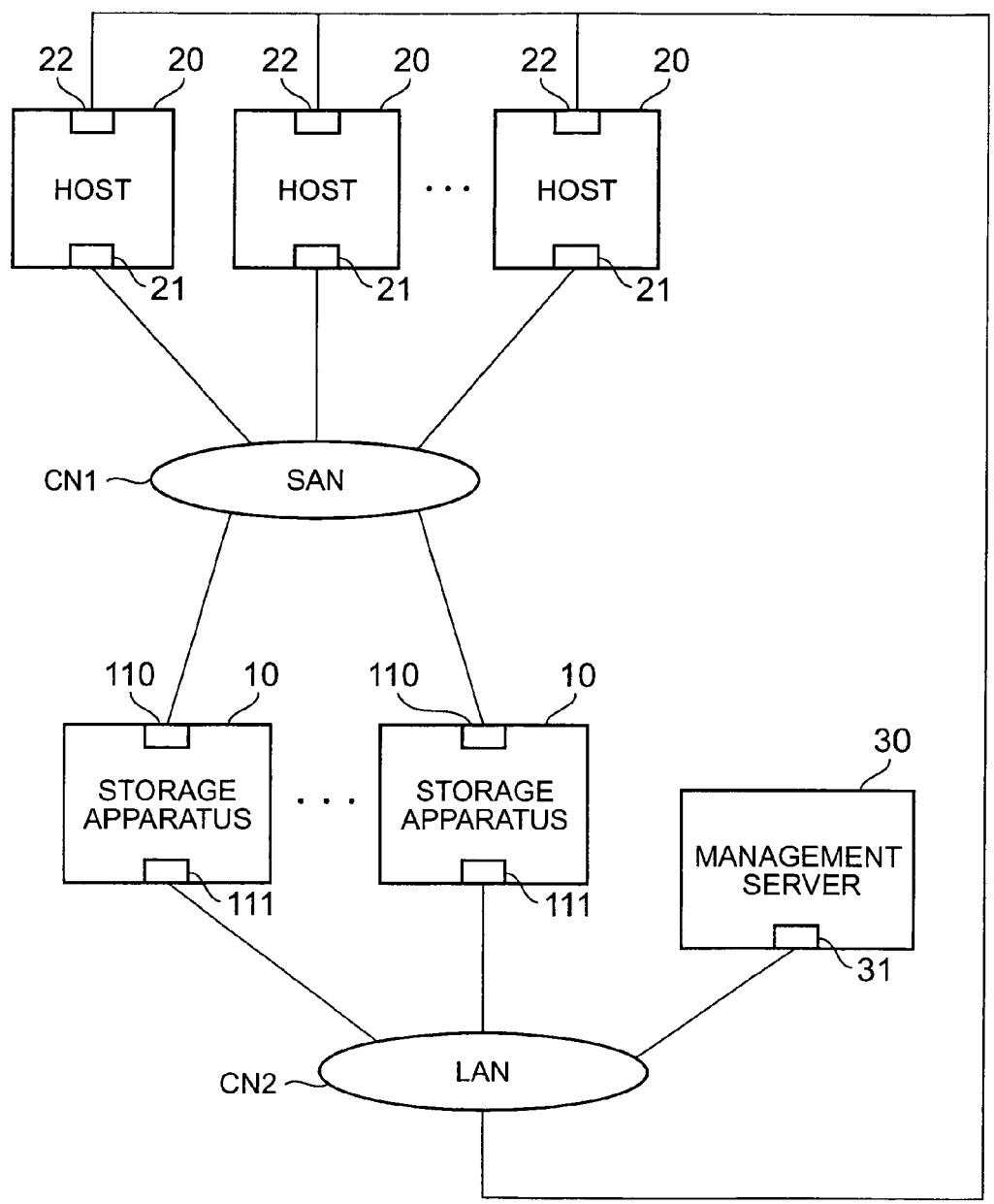
FIG. 2 is a diagram showing the overall construction of a storage system.

FIG. 2 is a diagram showing the overall construction of a storage system according to this embodiment. This storage system is constructed comprising for example 1 or a plurality of storage apparatuses 10, one or a plurality of hosts 20, and at least one management server 30.

The storage apparatus 10 corresponds to the storage apparatus 1 in FIG. 1. The host 20 corresponds to the external apparatus 2 in FIG. 1. The management server 30 corresponds to the management unit at 3 in FIG. 1. Details of the storage apparatus 10, host 20 and management server 30 are respectively described later.

The network construction of the storage system will be described with reference to FIG. 2. The hosts 20 and storage apparatus 10 are connected so as to be capable of mutual communication through for example a communication network CN1 such as a SAN (storage area network). An IP_SAN utilizing the IP (internet protocol) could also be used, or an FC_SAN utilizing the FCP (Fiber Channel Protocol) could be employed. An interface (I/F) 21 possessed by the host 20 and interface 110 possessed by the storage apparatus 10 are mutually connected through the communication network CN1.

The management server 30 is connected so as to be capable of respective mutual communication with the hosts 20 and storage apparatus 10 through a communication network CN2 such as for example a LAN (local area network). The interfaces 22 possessed by the hosts 20, the interface 111 possessed by the storage apparatus 10 and the interface 31 possessed by the management server 30 are mutually connected through the communication network CN2.

It should be noted that although in FIG. 2 the case is shown in which the data input/output network CN1 and management network CN2 are separated, there is no restriction to this, and a construction could be adopted in which input/output and management of data are performed using a single communication network. For example, a construction could be adopted in which the communication network CN2 is dispensed with and only a communication network CN1 is provided.

Next, an example of the hardware construction of the storage apparatus 10, host 20 and management server 30 will be described. For convenience in the drawings, the description will be given extracting only part of the construction of the storage system shown in FIG. 2. Also, first of all the construction of the host 20 and management server 30 will be described with reference to FIG. 3 and this will be followed by a description of the construction of the storage apparatus 10, with reference to FIG. 4.

Figure 3:
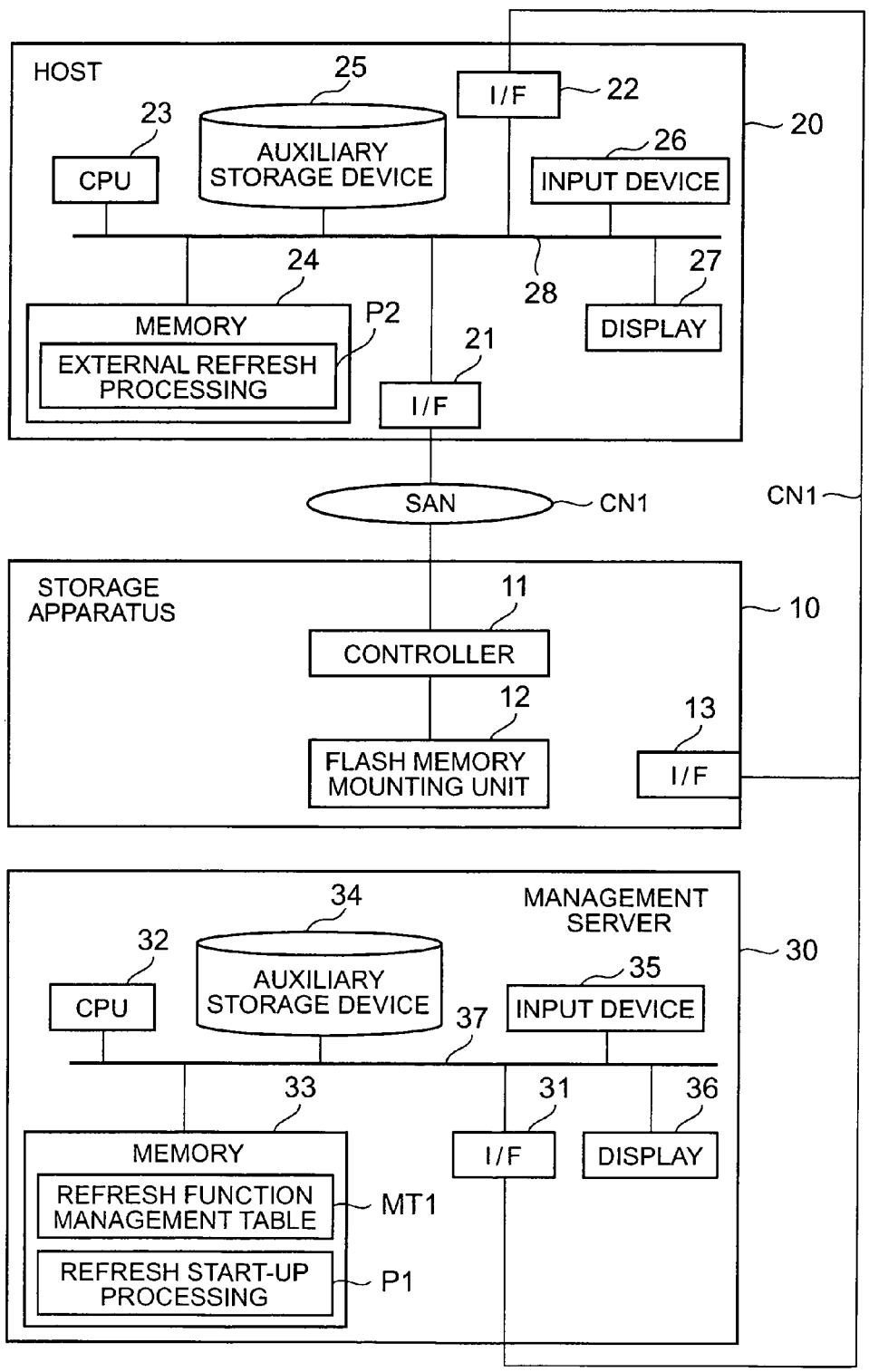
FIG. 3 is a diagram showing the hardware construction of a host and management server.
Figure 4:
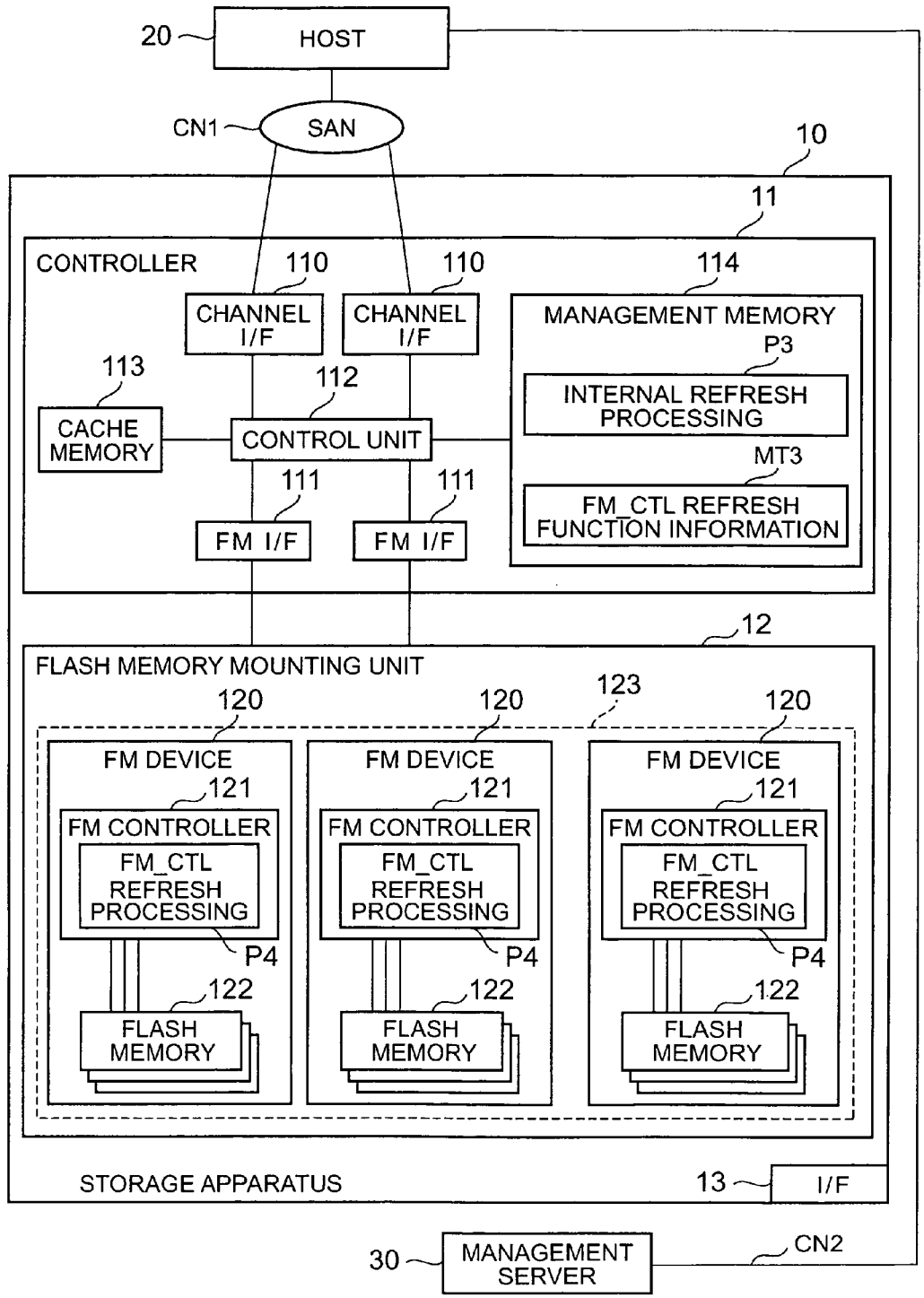
FIG. 4 is a diagram showing the hardware construction of a storage apparatus.

FIG. 3 shows the hardware construction focusing on the host 20 and management server 30. The host 20 will be described first. The host 20 is constructed as computer apparatus comprising for example 21 interfaces 21, 22, a processor ("CPU" in Figure) 23, memory 24, auxiliary storage device 25, input device 26, display 27 and a bus 28. For example, the host 20 may be constituted as for example a personal computer, workstation, server machine, mainframe machine, portable information terminal or mobile telephone.

The interface 21 serves for connection with the storage apparatus 10 through the communication network CN1. The interface 22 serves for connection with the management server 30 and storage apparatus 10 through the communication network CN2.

The processor 23 realizes prescribed functioning by reading and executing a program stored in memory 24. The memory 24 stores a program for realizing external refresh processing P2. External refresh processing P2 will be described later. Apart from the external refresh processing P2, the host 20 is arranged to be able to run in suitable fashion for example an OS (operating system) and/or programs such as enterprise function processing programs.

The auxiliary storage device 25 comprises for example a hard disk drive or semiconductor memory device. The input device 26 comprises for example a keyboard switch or pointing device, or microphone. The display 27 is an example of output apparatus and may be constituted for example by a liquid crystal display or plasma-display. The various units 21 to 27 described above are mutually connected by means of the bus 28.

The construction of the management server 30 will now be described. The management server 30 is constituted as computer apparatus comprising for example an interface 31, processor 32, memory 33, auxiliary storage device 34, input device 35, output apparatus 36 and bus 37. The management server 30 may be constituted for example as a personal computer or portable information terminal, or mobile telephone.

The interface 31 serves for connection of the hosts 20 and storage apparatus 10 through the communication network CN2. The processor 32 realizes prescribed functions by reading and executing a program stored in memory 33. In the memory 33 there are stored for example a refresh management processing table MT1 and a refresh start-up process P1. This table MT1 and refresh start-up process P1 will be described later. The auxiliary storage device 34 comprises for example a hard disk drive or semiconductor memory device. The input device 35 and display 36 are apparatus for exchanging information with the administrator, as described with reference to the construction of the host 20.

As shown in FIG. 3, the storage apparatus 10 is constituted comprising for example a control 11, flash memory mounting unit 12 and interface 13. An example construction of the storage apparatus 10 will be described with reference to FIG. 4.

The controller 11 performs overall control of the operation of the storage apparatus 10 and corresponds to the controller 4 in FIG. 1. The flash memory mounting unit 12 corresponds to the flash memory mounting unit 5 in FIG. 1. The interface 13 serves for connection of the host 20 and management server 30 through the communication network CN2. The construction of the controller 11 will be described first and this will be followed by a description of the construction of the flash memory mounting unit 12.

The controller 11 is constituted comprising for example an interface ("channel I/F" in the Figure) 110, an interface ("FM I/F" in the Figure) 111, control unit 112, cache memory 113, and a management memory 114.

One of these interfaces 110 serves for performing communication with the hosts 20 through the communication network CN1. The other interface 111 serves for performing communication with the flash memory devices 120 mounted on the flash memory mounting unit 12. The interface 110 controls data transfer between the hosts 20 and the cache memory 113 and the interface 111 controls data transfer between the flash memory devices 120 and cache memory 113. Consequently, the interfaces 110, 111 may be constructed as control circuits respectively comprising at least one or more processors.

The control unit 112 controls the operation of the controller 11 and comprises at least one or more processors. For example data written from the host 20 or data read from the flash memory device 120 are stored in the cache memory 113. The management memory 114 stores various types of management information or control information for managing the storage apparatus 10. For example, the management memory 114 stores the flash memory controller ("FM_CTL" in the Figure) refresh function information MT3 for managing whether or not a program for implementing the internal refresh processing P3 or a refresh function is provided by the flash memory device 120.

The construction of the flash memory mounting unit 12 will now be described. The flash memory mounting unit 12 is constituted comprising for example a plurality of flash memory devices 120. The flash memory devices 120 are constituted comprising at least one or more flash memory controllers 121 and one or a plurality of flash memories 122. A single flash memory device 120 corresponds to a single storage drive. In the Figures and in the following description, for convenience, "flash memory" is abbreviated as "FM".

The flash memory 122 holds the data written thereto from the FM controller 121 as voltage values (charge). The flash memory 122 is an example of a rewritable nonvolatile memory device. There is no restriction to a flash memory device, so long as the memory device is rewritable and nonvolatile. The present invention can be applied to memory devices of various types that require refresh operation when used for long-term preservation of data. The FM controller 121 is equipped with processing P4 for executing a refresh function. Specifically, the FM controller 121 can perform refreshing of data within the flash memory device 120.

It should be noted that the construction of the storage apparatus 10 described above and the construction of the host 20 and management server 30 are examples and the present invention is not restricted to the constructions described above.

Figure 5:
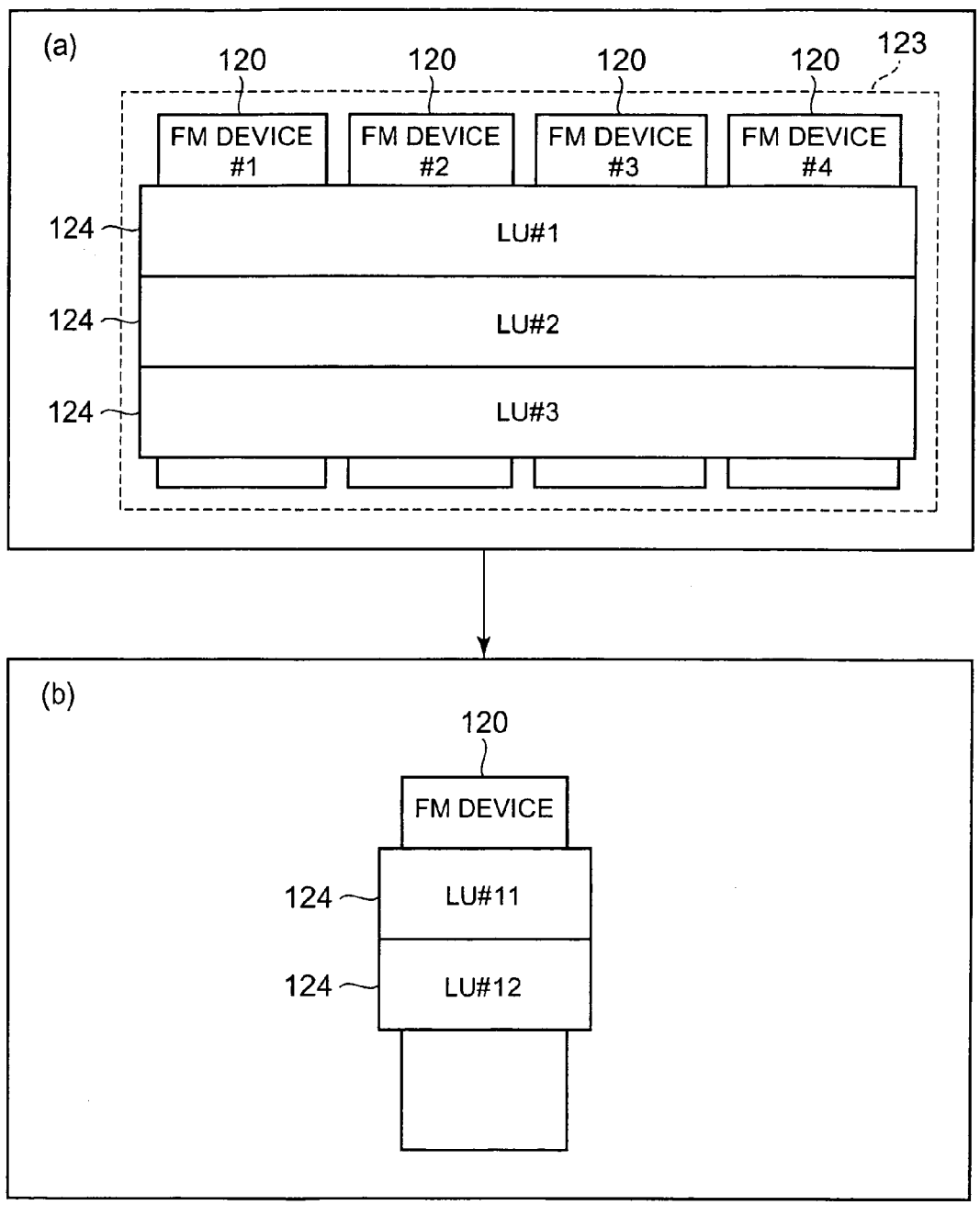
FIG. 5 is a diagram showing the relationship between a flash memory device and logical device.

FIG. 5 is a diagram showing schematically the relationship of a physical storage region possessed by a flash memory device 120 and a logical device 124. As shown in FIG. 5A, the physical storage regions respectively possessed by the flash memory devices 120 can be virtualized as a single RAID Group (parity group) 123. One or a plurality of logical devices (LU) 124 can thus be set up by partitioning this virtualized physical storage region 123.

Consequently, for example when the data stored in the logical device 124 specified as "LU #1" is refreshed, the data in the range corresponding to the logical device 124 (LU #1) of the subject of refresh, of the storage regions of the flash memory device 120, is respectively read from the flash memories 122 and written back to its original position. It should be noted that, as shown in FIG. 5B, one or a plurality of logical devices 124 may be set up in a single flash memory device 120.

Figure 6:
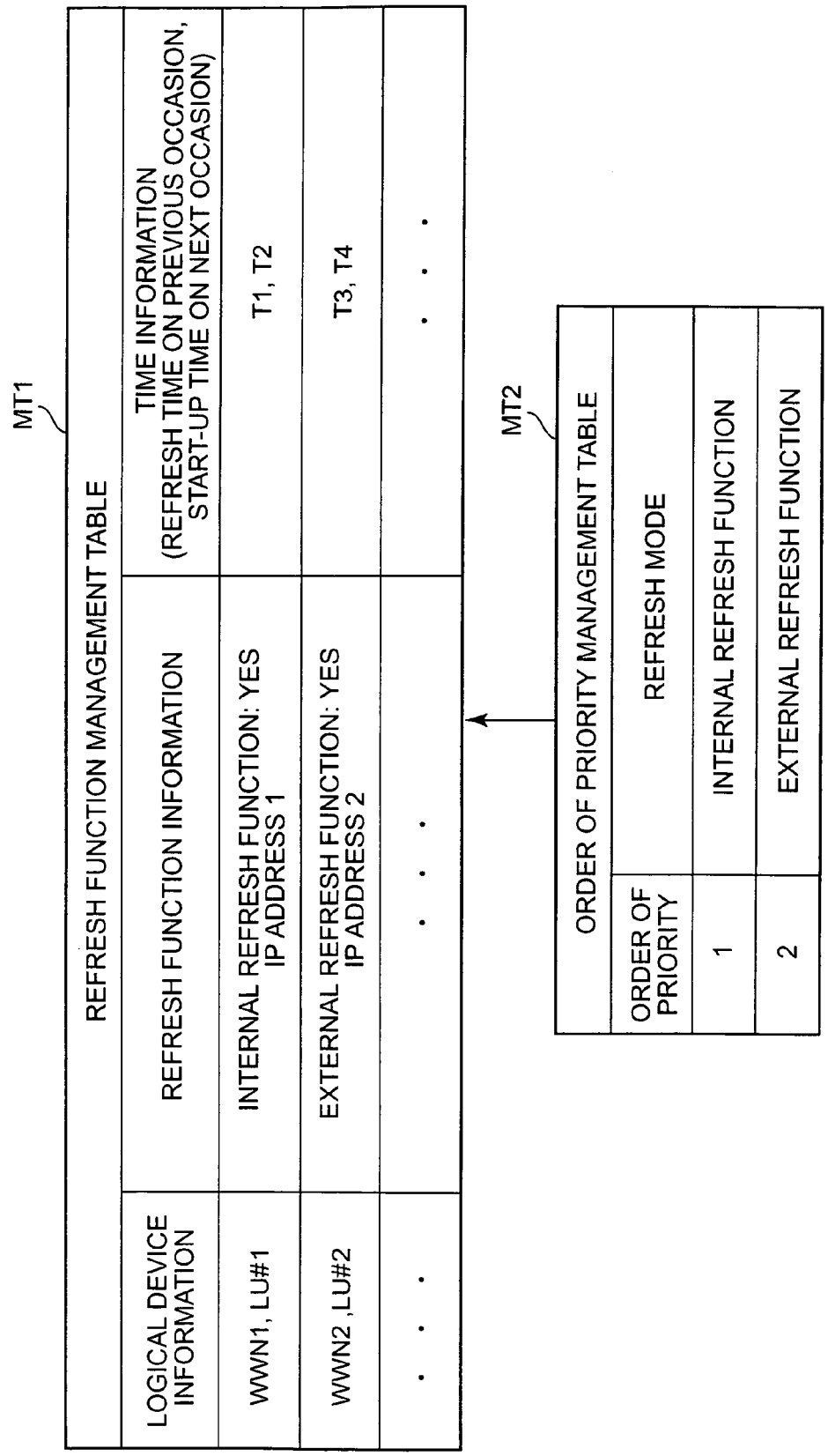
FIG. 6 is a diagram showing a refresh function management table and an order of priority management table.

FIG. 6 is a diagram showing a table MT1 for managing the refresh function. This table MT1 for example respectively manages the refresh mode to be employed and the refresh time, for each of the logical devices 124.

This management table MT1 associates and manages for example the logical device information for uniquely identifying each logical device 124 in the storage system, refresh function information indicating the type (refresh mode) of refresh function employed in respect of this logical device, and Time information regarding refreshing.

For example the WWN (worldwide name) or logical device number may be employed as the logical device information. An arrangement may also be adopted in which management is effected in combination with for example the storage apparatus number or manufacturing number or storage apparatus name for respectively identifying the storage apparatuses 10.

In the refresh function information there are respectively set information for specifying the type of refresh function that is to be employed in respect of the logical device in question and the apparatus that executes the refresh function.

As shown in the order of priority management table MT2 in FIG. 6, an order of priority is set up beforehand in regard to the various types of refresh mode (refresh function) that are provided in the storage system. For example, the internal refresh function P3 is set to a higher priority than the external refresh function P2. Consequently, in respect of a given logical device 124, in cases where it is possible to execute both internal refresh processing or external refresh processing, internal refresh processing, in respect of which a higher priority is set, is selected and registered in the table MT1.

As the information for specifying the subject in respect of which refresh processing is to be executed, for example its IP address may be employed. That is, when the external refresh function is set in the table MT1, the IP address of the host 20 whereby this external refresh function is to be executed is set in the table MT1. Also, when the internal refresh function is set in the table MT1, the IP address of the storage apparatus 10 whereby this internal refresh function is to be executed is set in the table MT1. The IP address is an example of information for specifying the nodes (storage apparatus 10, host 20) that are connected by the communication network CN2. In this way, the management server 30 is able to immediately ascertain to which apparatus, of the hosts 20 and storage apparatuses 10, a command should be issued.

As the Time information, there may be respectively stored for example the refresh time point on the previous occasion and the refresh start-up time point on the next occasion. The refresh time point on the previous occasion is information indicating the time point at which refresh processing was started up on the previous occasion. As the refresh start-up time point on the next occasion, a prescribed value for the lapsed time from the refresh time point on the previous occasion is set. The refresh interval may be set for example at every three years, every five years or every seven years. It is possible to make the refresh interval respectively different for each of the logical devices 124. The refresh mode that was employed in the refresh processing on the previous occasion is stored for example in the table MT1.

Figures 7, 8:
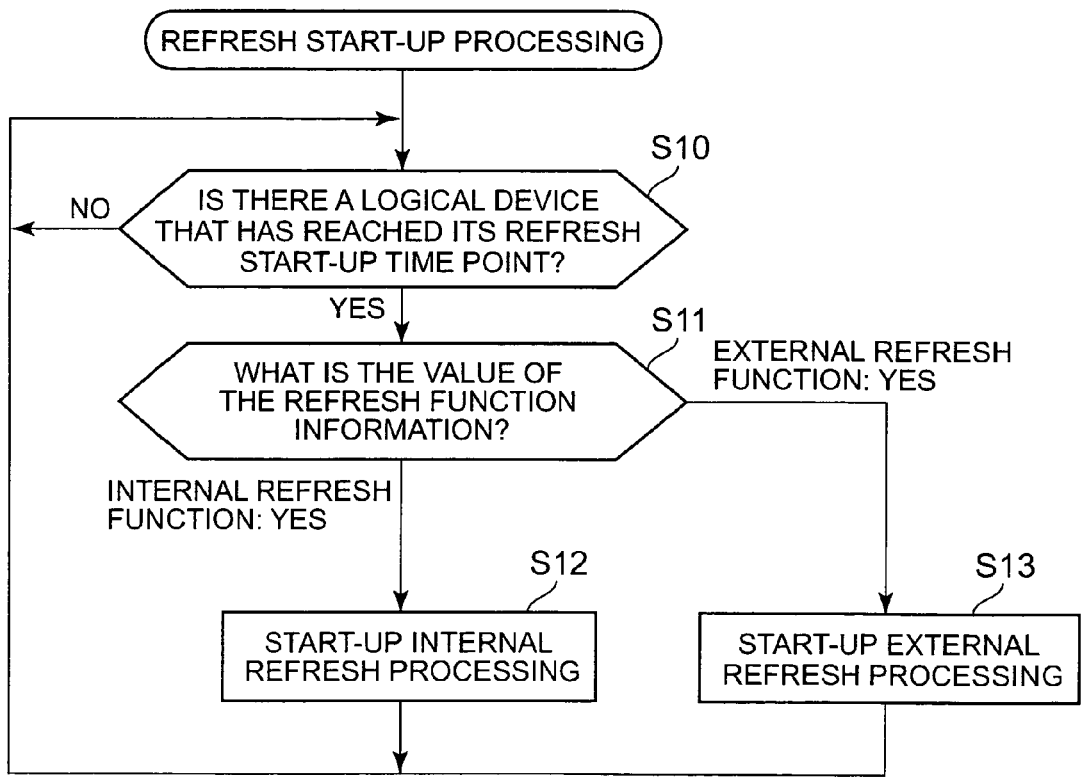
FIG. 7 is a diagram showing a table for managing the refresh function provided by a flash memory controller.
FIG. 8 is a flow chart showing refresh start-up processing.

FIG. 7 is a diagram showing a table MT3 for processing of the refresh function in respect of the FM controller 121. This management table MT3 associates and manages for example information for respectively identifying the FM controllers 121, and information for indicating whether or not the FM controllers 121 are provided with a refresh function. If an FM controller 121 is provided with a refresh function (if the second internal refresh mode can be executed), "Yes" is set in the column indicating presence or absence of a refresh function.

Next, refresh control of a storage system according to this embodiment is described with reference to FIG. 8 to FIG. 11. It should be noted that the flow charts below merely represent an outline of the various processes to an extent necessary for understanding and implementation of the present invention and may differ from the actual program. Also, in the following description, "step" is abbreviated as "S".

FIG. 8 is a flow chart showing refresh start-up processing. This processing is executed with a prescribed period (for example every hour) by the management server 30. First of all, the management server 30 respectively compares the refresh start-up time point on the next occasion that is set for each logical device 124 with the current time point, by referring to the table MT1. The management server 30 then determines (S10) whether or not a logical device 124 exists in respect of which the refresh start-up time point on the next occasion that is set in the table MT1 exceeds the current time point. If not even a single logical device 124 that should be refreshed is discovered (S10: NO), the management server 30 waits for lapse of a prescribed time and then again executes S10.

The logical device 124 that has reached the refresh start-up time point corresponds to "prescribed logical device that has reached the refresh time point". In the following description, the prescribed logical device 124 may sometimes be termed "logical device 124 that is the subject of refresh".

If a logical device 124 is discovered that has reached the refresh start-up time point (S10: YES), the management server 30 ascertains (S11) the value of the refresh function information relating to this logical device 124. If, in the table MT1, "internal refresh function: Yes" is set, the management server 30 starts up (S12) internal refresh processing P3 by issuing a start-up command to the apparatus (storage apparatus 10) possessing the IP address that is set in the table MT1. In contrast, if, in the table MT2, there is set "external refresh function: Yes", the management server 30 starts up external refresh processing P2 by issuing a start-up command to the apparatus (host 20) possessing the IP address that is set in the table MT1.

Figure 9:
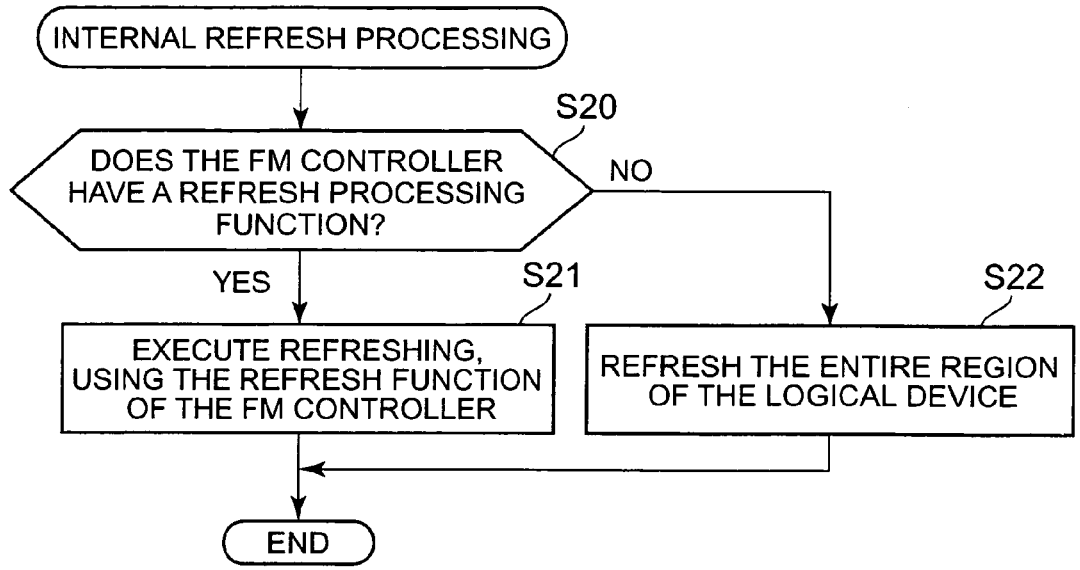
FIG. 9 is a flow chart showing internal refresh processing.

FIG. 9 is a flow chart showing the internal refresh processing P3. The internal refresh processing P3 is executed when a start-up command is received from the management server 30 by the controller 11 of the storage apparatus 10.

The start-up command that is received from the management server 30 includes information specifying the logical device 124 that is the subject of refresh. The controller 11 manages which storage region of the flash memory device 120 is utilized by the logical devices 124 that are under the control of the controller 11. Consequently, the controller 11 can specify one or a plurality of flash memory devices 120 corresponding to the logical device 124 that is the subject of refresh.

By referring to the table MT2, the controller 11 identifies (S20) whether or not the FM controller 121 corresponding to the logical device 124 that is the subject of refresh is equipped with a refresh function (FM_CTL refresh processing) P4.

If the FM controller 121 is equipped with a refresh function P4 (S20: YES), the controller 11 executes the refresh function P4 provided by the FM controller 121 and thereby effects refreshing (S21) of the data in the flash memory device 120. Specifically, the controller 11, by means of the refresh function P4 provided by the FM controller 121, first reads the data in respect of the entire region of the logical device 124 that is the subject of refresh, and then writes this data back. For this purpose, the controller 11 specifies the refresh start address relating to the data region that is the subject of refresh, and the data length to be refreshed, and supplies these in the form of an instruction to the FM controller 121.

In contrast, if the FM controller 121 is not equipped with a refresh function P4 (S20: NO), the controller 11 refreshes the data (S22). Specifically, the controller 11 first reads the data stored in the logical device 124 that is the subject of refresh, to the cache memory 113, a fixed amount at a time, and then writes this data that has thus been read, back to its original storage position without modification. The data in the logical device 124 can be refreshed by executing, a fixed amount at a time, such reading processing of data and writing processing of data in respect of the entire region of the logical device 124 that is the subject of refresh.

Figure 10:
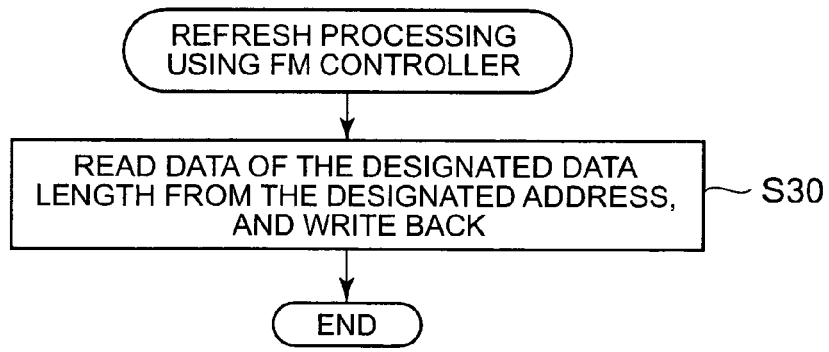
FIG. 10 is a flow chart showing the refresh processing executed by a flash memory controller.

FIG. 10 is a flow chart showing the refresh processing P4 performed by the FM controller 121. This processing is started up by the internal refresh processing P3 of the controller 11 and is executed by the FM controller 121.

In this processing, the refresh region information is received as a parameter from the internal refresh processing P3. The refresh region information is specified from the refresh start address and data length. The FM controller 121 reads data of the data length specified from the refresh start address to a temporary storage region incorporated in the FM controller 121 or a temporary storage region provided outside the FM controller 121, and then writes back (S30) to the original address this data that has thus been read.

Figure 11:
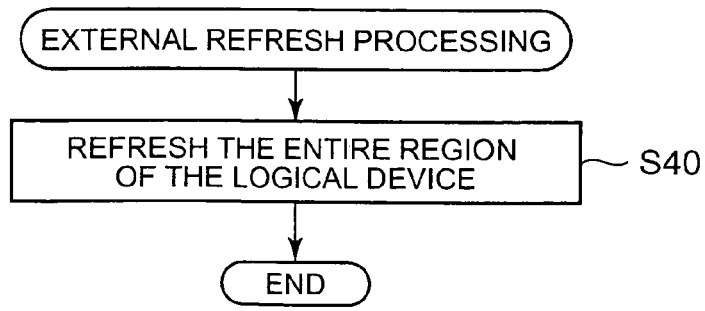
FIG. 11 is a flow chart showing external refresh processing.

FIG. 11 is a flow chart showing the external refresh processing P2. This processing is started by the refresh start-up processing P1 of the management server 30 and is executed by the processor 23 of the host 20.

The host 20 executes refresh (S40) in respect of the entire region of the logical device 124 that is the subject of refresh. Specifically, the processor 23 of the host 20 reads the data in the logical device 124 that is the subject of refresh to the memory 24, a fixed amount at a time. After this, the processor 23 writes back this data that has thus been read to its original location, without modification. This task is executed in respect of the entire region of the logical device 124 that is the subject of refresh.

The construction of the present embodiment as described above gives the following benefits. With this embodiment, since data is preserved using flash memory devices 120, power consumption can be reduced compared with the case where hard disk drives are employed, making it possible to reduce the size and weight of the storage apparatus 10 and so making it possible to lower the total cost of ownership of the storage apparatus 1.

In this embodiment, the data in the logical device 124 can be refreshed using either of the internal refresh processing P3 or external refresh processing P2. Furthermore, in the internal refresh processing P3, refreshing of the data in the logical device 124 can be achieved using either of the controller 11 of the storage apparatus 10 or the FM controller 121 of the flash memory device 120. Consequently, an appropriate refresh mode can be set in accordance with for example the construction of the storage system, thereby making it possible to prevent loss of data preserved long-term and increasing ease of use.

In this embodiment, the refresh mode and the time point of start-up of refresh can be set for each logical device 124. Consequently, data refresh can be performed in units (logical devices 124) that are utilized by the host 20. In this way, linkage of refresh processing with other processing such as for example data migration of volume copying can easily be achieved.

In this embodiment, the priority of internal refresh processing P3 is set to be higher than the priority of external refresh processing P2. In this way, refreshing of data in the storage apparatus 10 can be achieved without increasing the processing load of the host 20.

It should be noted that, even in the case where one of external refresh processing P2 and internal refresh processing P3 is employed, the life of the flash memory devices 120 can be extended by wear leveling processing. "Wear leveling processing" is processing aimed at achieving a distribution of the number of times of writing, so that data is written to locations that have not been written to often, so that writing is not concentrated in specific locations. In this way, it is possible to prevent writing to specific locations from becoming impossible due to the upper limit of writing to such specific locations being reached.

For example, a number of times of writing management table can be provided that manages the number of times of writing in certain fixed units such as for example address units. The life of a flash memory device 120 can be extended by exercising control such that data is written to addresses with a low number of times of writing, by referring to this number of times of writing management table. For example, by adding a portion for cumulative managing of the number of times of writing of each writing management unit to the refresh function management table MT1, refresh processing taking account of wear leveling processing can be performed.

Embodiment 2

A second embodiment is described with reference to FIG. 12 to FIG. 18. The following embodiments, including the present embodiment, correspond to modified examples of the first embodiment described above. Consequently, in this embodiment, the description will focus on aspects of difference with regard to the first embodiment described above. In this embodiment, after reading data from a logical device 124 in another storage apparatus 10, the data is refreshed by one storage apparatus 10U by writing the data back to its original location.

Figure 12:
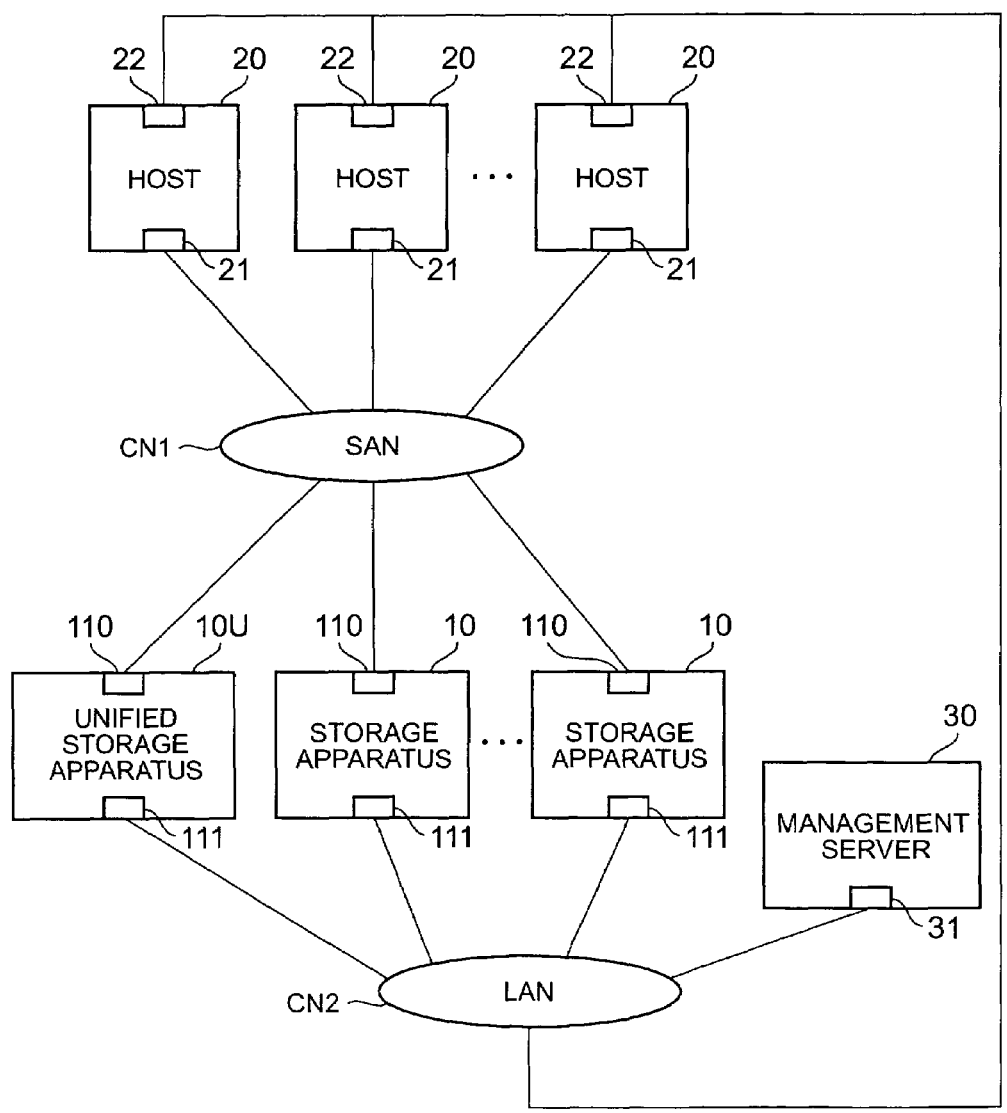
FIG. 12 is a diagram showing the overall construction of a storage system according to a second embodiment.

FIG. 12 is a diagram showing the overall construction of a storage system according to this embodiment. In this storage system, unified storage apparatus 10U is newly provided. This unified storage apparatus 10U may be constructed in the same way as the storage apparatus 10, these being respectively connected by means of communication networks CN1 and CN2.

The unified storage apparatus 10U presents a logical device 124 in another storage apparatus 10 to a host 20 as if this logical device 124 were a logical device of the unified storage device 10U itself. Specifically, this unified storage apparatus 10U makes possible unified management of a plurality of logical devices 124 dispersed in the storage system in virtualized fashion as if these logical devices 124 were within the unified storage apparatus 10U.

By virtualized management of the logical devices 124 provided by the storage apparatus 10 within the unified storage apparatus 10U, it is possible to apply the various functions (such as for example snapshot or remote copying) possessed by the unified storage apparatus 10U to the virtualized logical devices also.

When viewed from the unified storage apparatus 10U, another storage apparatus 10 constitutes a storage apparatus positioned outside the unified storage apparatus 10U. Consequently, the storage apparatus 10 may be termed an external storage apparatus or connection target storage apparatus. In contradistinction, the unified storage apparatus 10U may be termed connection source storage apparatus.

Figure 13:
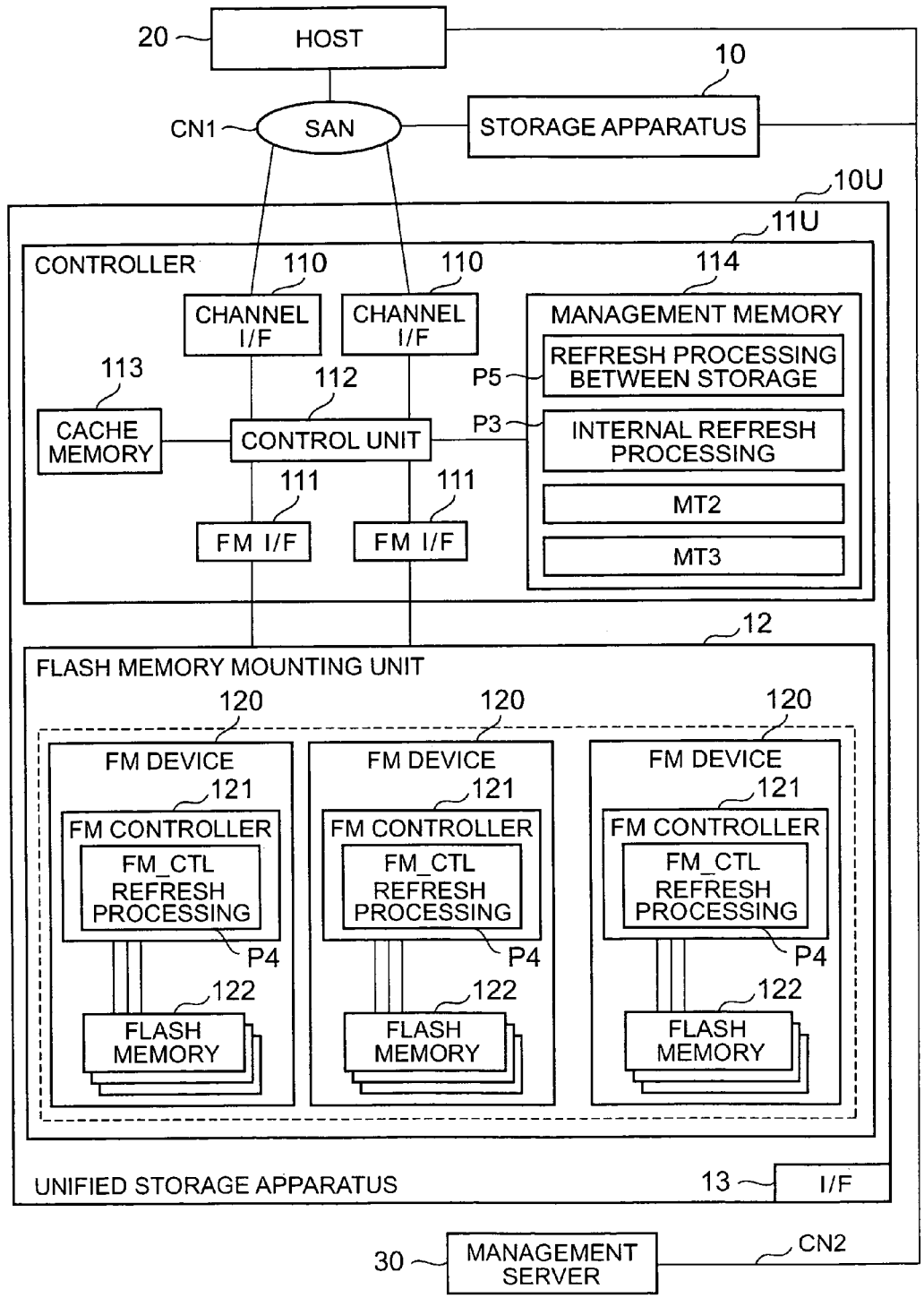
FIG. 13 is a diagram showing the hardware construction of an unified storage apparatus.

FIG. 13 is a construction diagram focusing on the unified storage apparatus 10U. The controller 11U of the unified storage apparatus 10U is constructed in the same way as the aforesaid controller 11. However, a program for implementing refresh processing P5 between storage is stored within the management memory 114.

In the storage management refresh processing P5, the unified storage apparatus 10U that constitutes the connection source implements data refresh processing in respect of a logical device 124 within the storage apparatus 10 that is the connection target. The refresh processing P5 between storage may also be termed for example refresh processing performed by the unified of storage apparatus. This refresh processing P5 between storage will be described later.

Figure 14:
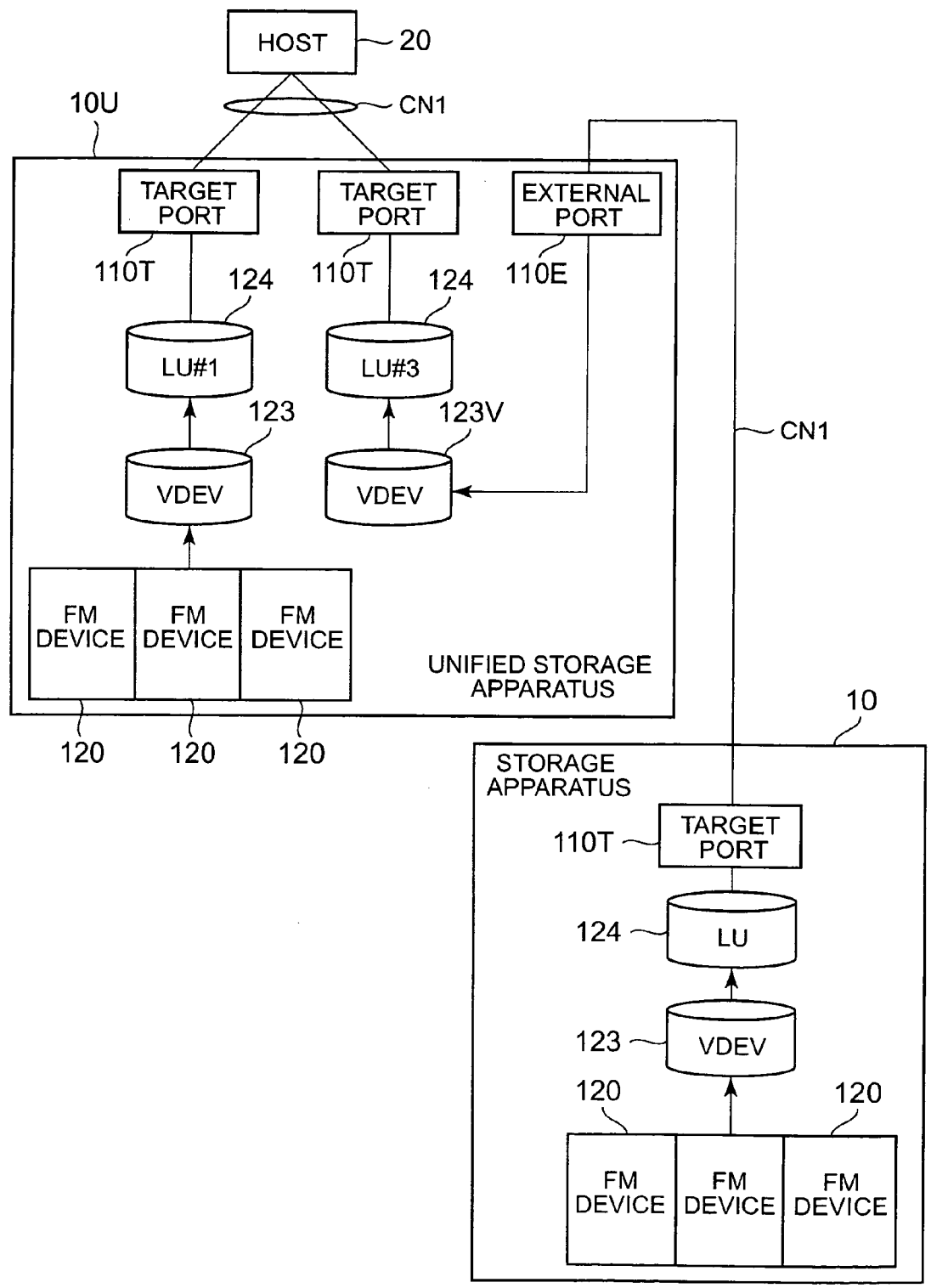
FIG. 14 is a diagram showing the storage construction of an unified storage apparatus and an external storage apparatus.

FIG. 14 is a diagram showing schematically how the unified storage apparatus 10U acquires a logical device 124 possessed by another storage apparatus 10. Referring to the memory structure of the unified storage apparatus 10, as shown at the top left in FIG. 14, a target port 110T for receipt of instructions, from a host 20 has a logical device 124 (LU #1) connected to it. This logical device 124 is connected with one or more flash memory devices 120 through an intermediate device (VDEV) 123.

In other words, the physical storage region possessed by one or a plurality of flash memory devices 120 is virtualized as an intermediate device 123 and the logical device 124 (LU #1) is configured on this intermediate device 123. This logical device 124 is termed a real logical device, since it is generated based on a physical storage device (flash memory device 120) within the unified storage apparatus 10U.

In contrast, another logical device (LU #3) 124 within the unified storage apparatus 10U is connected with the intermediate device 123V. This intermediate device 123V is connected with the logical device 124 in the other storage apparatus 10 through for example a port for external connection (external port) 110E and communication network CN1. Specifically, the storage region of the logical device 124 possessed by the other storage apparatus 10 is mapped onto the logical device 124 (LU #3) in the unified storage apparatus 10U through the intermediate device 123V.

Thus, the logical device 124 (LU #3) that utilizes the logical device 124 possessed by the other storage apparatus 10 constitutes a window for performing data input/output and in fact the device that stores the data is a logical device 124 within the storage apparatus 10. Since this logical device 124 (LU #3) is not a device based on the flash memory device 120 in the unified storage apparatus 10U, it may be called a virtual logical device. Consequently, if only virtual logical devices are provided in the unified storage apparatus 10U, the unified storage apparatus 10U does not need to be provided with flash memory devices 120.

FIG. 15 shows an example of a mapping table MT4 that is employed for utilization by the unified storage apparatus 10U of a logical device 124 within another storage apparatus 10. This table MT4 is stored for example in a management memory 114 in the unified storage apparatus 10U.

This table MT4 may be constituted by associating for example the LUN (logical unit number), number of the logical device 124, and information for identifying an intermediate device 123. The information for identifying an intermediate device 123 (including 123V) may include for example the number of the intermediate device, information indicating the type of physical storage device with which the intermediate device is connected, and route information for connection to the physical storage device.

In the case of a real logical device, as the route information, the route to a flash memory device 120 within the unified storage apparatus 10U is set. In the case of a virtual logical device, the WWN or LUN for accessing a logical device 124 of another storage apparatus 10 is set.

When the host 20 issues an access request (write command or read command) to a virtual logical device 124 (LU #3 in the case of the above example), the controller 11U of the unified storage apparatus 10U converts this access request from the host 20 to an access request to the logical device 124 that is associated with the virtual logical device 124. This conversion can be performed by a control unit 112 within the controller 11U.

Figure 16:
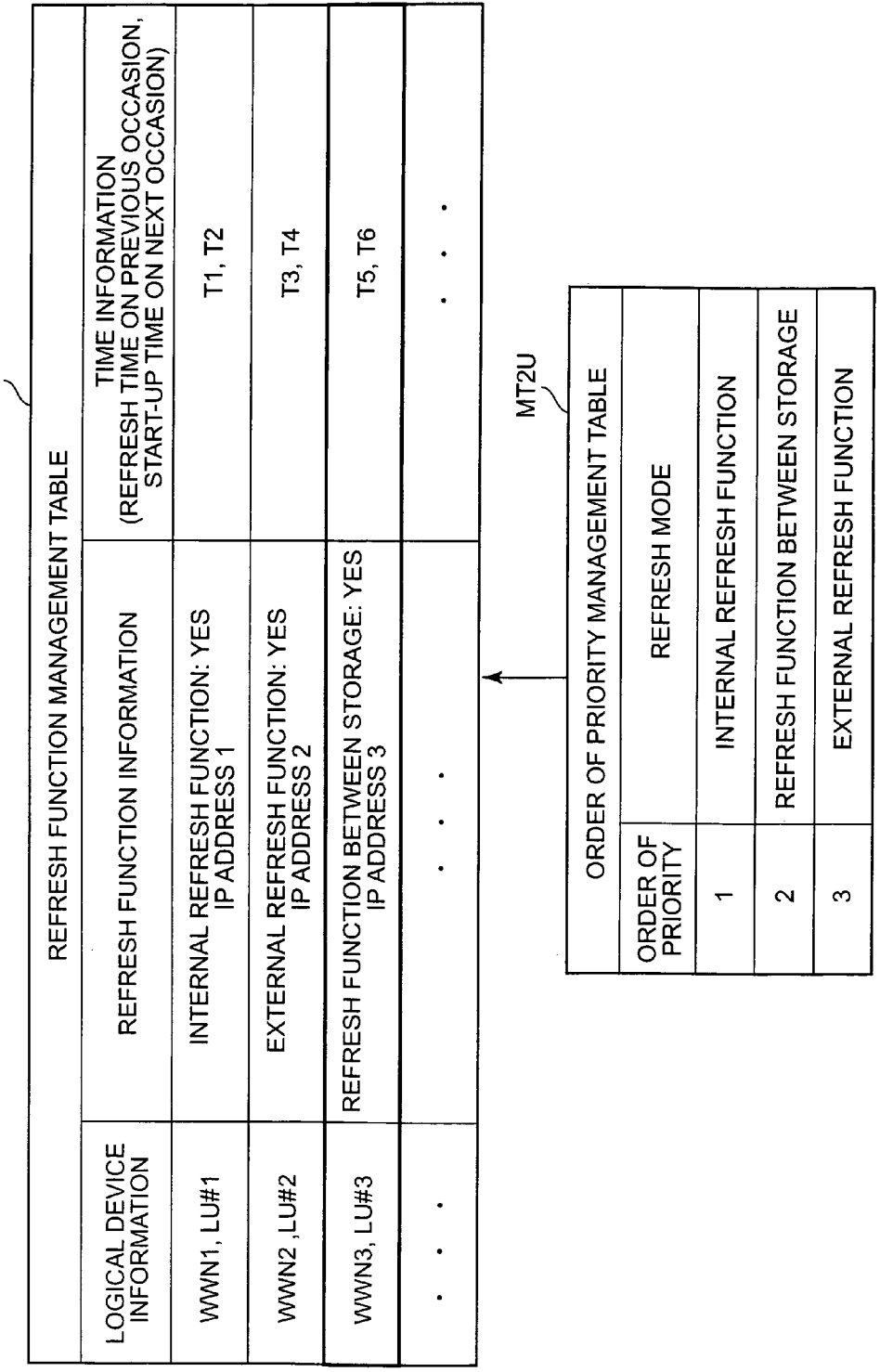
FIG. 16 is a diagram showing a refresh function management table and an order of priority management table.

FIG. 16 is a diagram showing a refresh function management table MT1U that is employed in this embodiment. As shown by the thick line in FIG. 16, this table MT1U is different from the table MT1 shown in FIG. 6 in that it is possible to select a refresh function between storage as refresh function information. When a storage management refresh function is set, the IP address of the unified storage apparatus 10U is set as the IP address.

Also, in the order of priority management table MT2U, a refresh function between storage is added. In this embodiment, in order to reduce the load of the storage system, degrees of priority are set in the order: (1) internal refresh function, (2) refresh function between storage, and (3) external refresh function.

Figure 17:
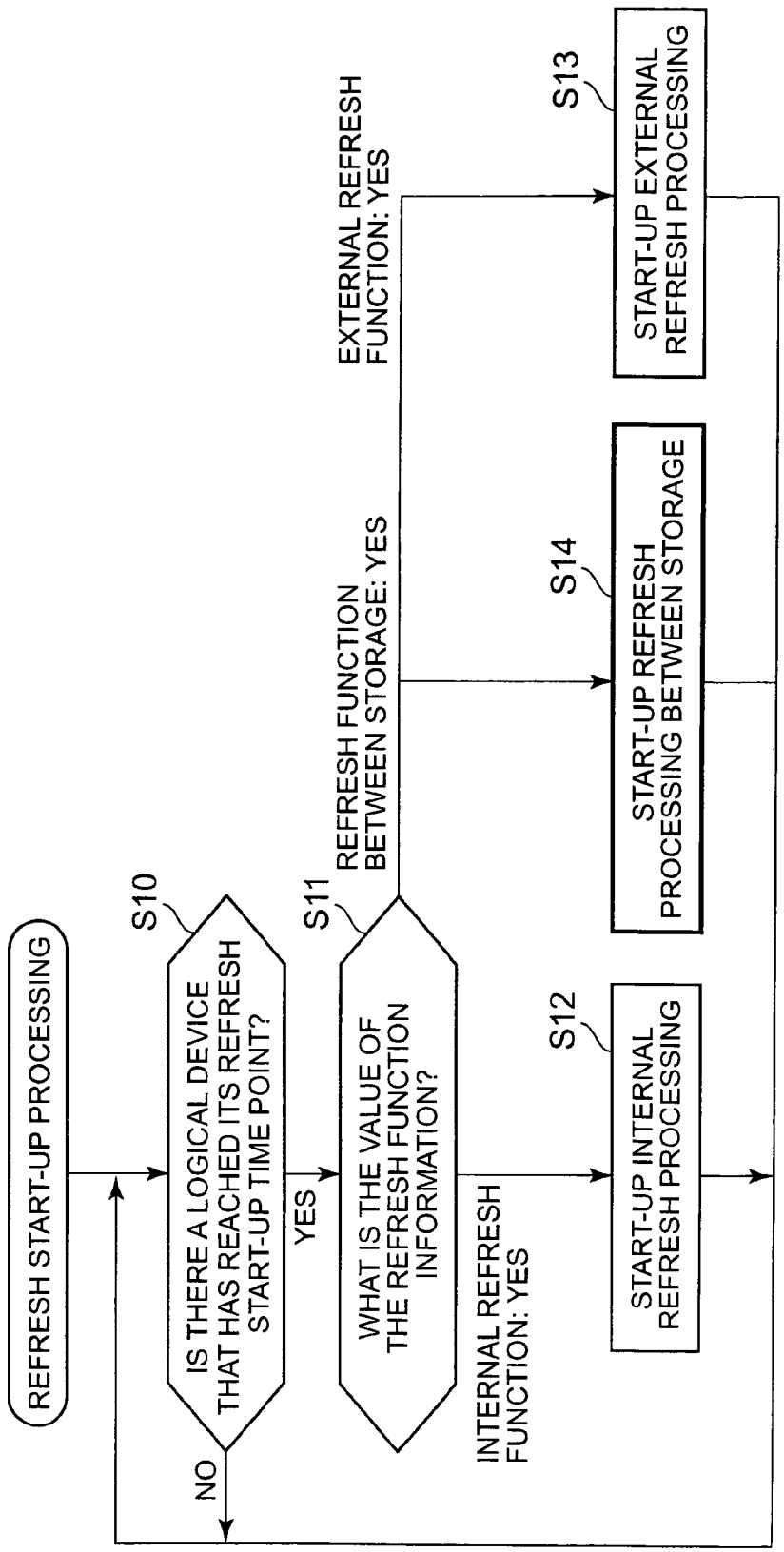
FIG. 17 is a flow chart showing refresh start-up processing.

FIG. 17 is a flow chart showing refresh start-up processing according to this example. In comparison with the flow chart shown in FIG. 8, S14 is newly added in this processing. Specifically, if "refresh function between storage: Yes" is set as the value of the refresh function information, the management server 30 issues a start-up command to the unified storage apparatus 10U and starts up the refresh processing P5 between storage (S14).

FIG. 18 is a flow chart showing the refresh processing P5 between storage. This processing is started up by the refresh start-up processing P1 of the management server 30 and is executed by the controller 11U of the unified storage apparatus 10U.

In this processing, refreshing of data is performed (S50) in respect of the entire region of the logical device 124 that is the subject of refresh. Specifically, by accessing the storage apparatus 10, the unified storage apparatus 10U reads the data in the logical device 124 that is the subject of refresh to the cache memory 113, a fixed amount at a time. This data that has thus been read is then written back to the logical device 124 in the storage apparatus 10. This operation is executed in respect of the entire region of the logical device 124 that is the subject of refresh.

This embodiment constructed in this way has the same beneficial effects as the first embodiment described above. In addition, in this embodiment, data stored in a logical device possessed by connection target storage apparatus 10 can be refreshed within the unified storage apparatus 10U in which the logical devices in the storage system are virtualized. Consequently, even in the case where neither the controller 10 nor the FM controller 121 in the storage apparatus 10 that is the target of connection is provided with a refresh function, refreshing of data can be performed without increasing the processing load of the host 20.

In this embodiment, data can be refreshed in respect of a logical device 124 in external storage apparatus 10 by the unified storage apparatus 10U. Consequently, for example refreshing of data in respect of a logical device 124 in the external storage apparatus 10 can be performed by connecting the unified storage apparatus 10U and the external storage apparatus 10 only when necessary, the external storage apparatus 10 being normally used as off-line storage. In this way, for example data that is to be preserved over a comparatively long period can be managed by storage in a logical device 124 in external storage apparatus 10, making it possible to utilize external storage apparatus 10 more efficiently. Also, since the external storage apparatus 10 need only be supplied with power and started up when the time point for starting up of refreshing has arrived, the power consumption of the storage system can be further reduced.

Embodiment 3

A third embodiment is described with reference to FIG. 19 to FIG. 21. In this embodiment, even when a logical device 124 has reached the time point for start-up of refreshing, if prescribed processing that makes refresh processing unnecessary has been already executed, refresh processing is not executed.

In the refresh function management table MT1A shown in FIG. 19, flag information that indicates whether or not refreshing is required is added. The initial value of this information is set to "refreshing required", but, if prescribed processing has been executed, this is changed to "refreshing not required".

Figure 20:
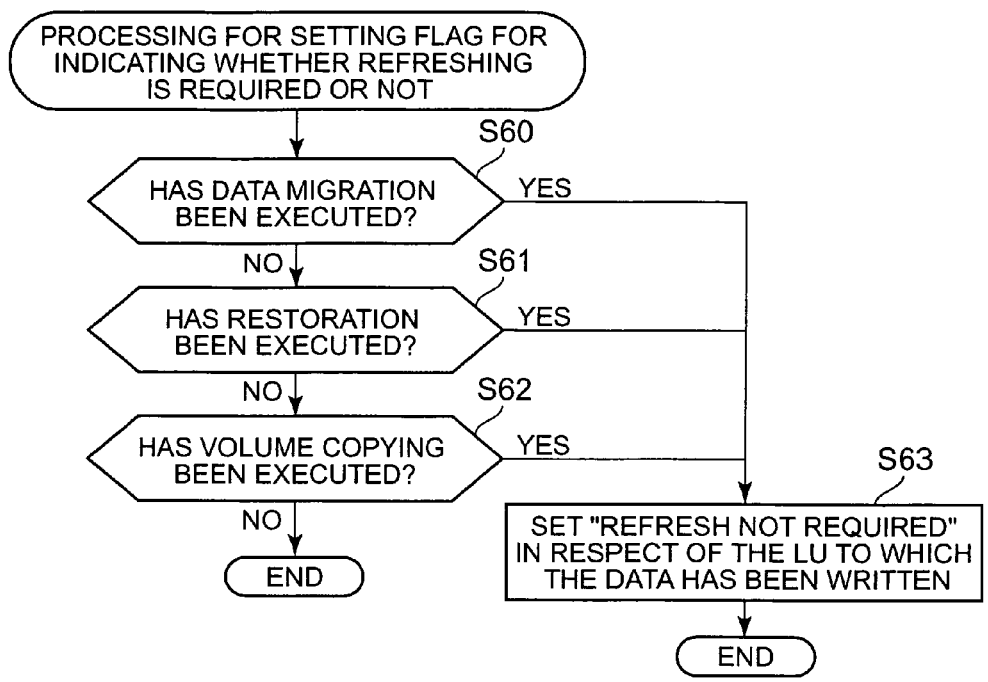
FIG. 20 is a flow chart showing processing for setting a flag indicating whether or not refresh is required.

FIG. 20 shows the processing for setting this flag that indicates whether or not refreshing is required. This processing is executed for example by a management server 30. The management server 30 for example monitors whether or not data migration has been executed (S60), whether or not restoration has been executed (S61) and whether or not volume copying has been executed (S62).

This data migration, restoration, or volume copying corresponds to prescribed processing; if it is detected that prescribed processing has been executed (S60: YES, S61: YES, S62: YES), the management server 30 sets (S63) the value of the flag for indicating whether or not refreshing is required to "refreshing not required" in respect of the logical device whose data was written by this prescribed processing. Such prescribed processing is processing that involves writing of all of the data in the logical device in question, so the data is refreshed at the time point where this prescribed processing has terminated.

Figure 21:
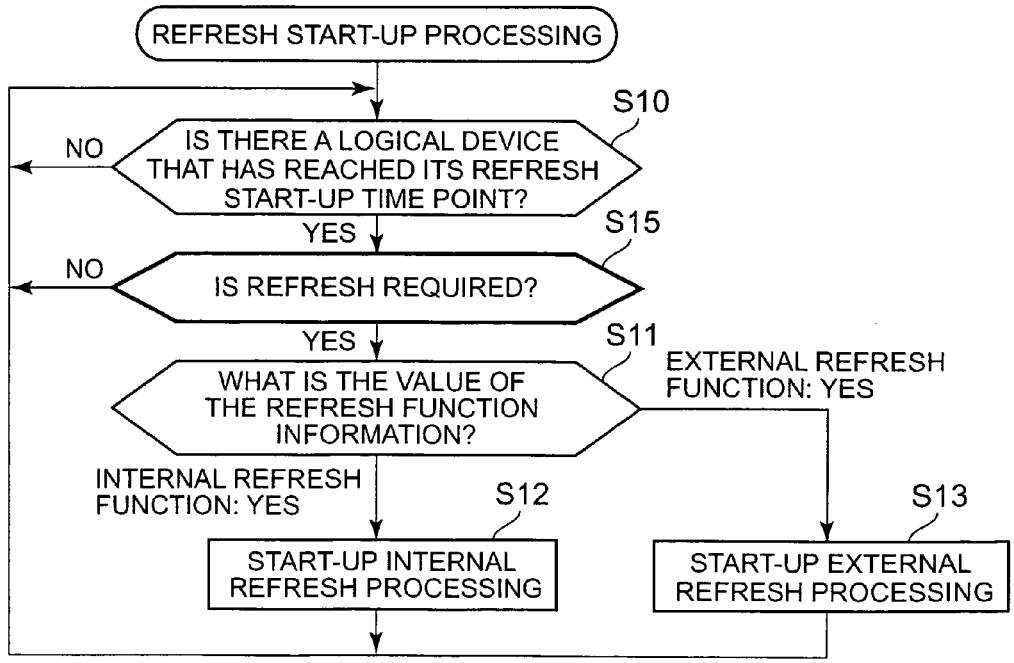
FIG. 21 is a flow chart showing refresh start-up processing.

FIG. 21 is a flow chart showing refresh start-up processing. The difference with regard to the flow chart shown in FIG. 8 is that, if a logical device 124 is detected (S10: YES) that has reached the refreshing start-up time point, the management server 30 checks the value of the flag for indicating whether or not refreshing is required and determines whether or not this flag should be set to "refreshing required" (S15). If this flag has been set to "refreshing not required" (S15: Yes), the management server 30 does not start-up refresh processing, but again executes S10 after a lapse of a prescribed time.

The embodiment constructed in this way exhibits the same beneficial effect as in the case of the first embodiment. In addition, in this embodiment, if prescribed processing whereby all of the data in the logical device 124 is effectively refreshed has already been executed prior to the refreshing start-up time point, refresh processing is not executed, so performance of unnecessary refresh processing can be prevented. It should be noted that, after start-up of refresh processing has thus been blocked, the administrator can set a new refreshing start-up time point by manual operation.

Embodiment 4

A fourth embodiment is described with reference to FIG. 22. In this embodiment, if prescribed processing that renders refresh processing unnecessary has been executed, the refreshing start-up time point on the next occasion is automatically revised.

Figure 22:
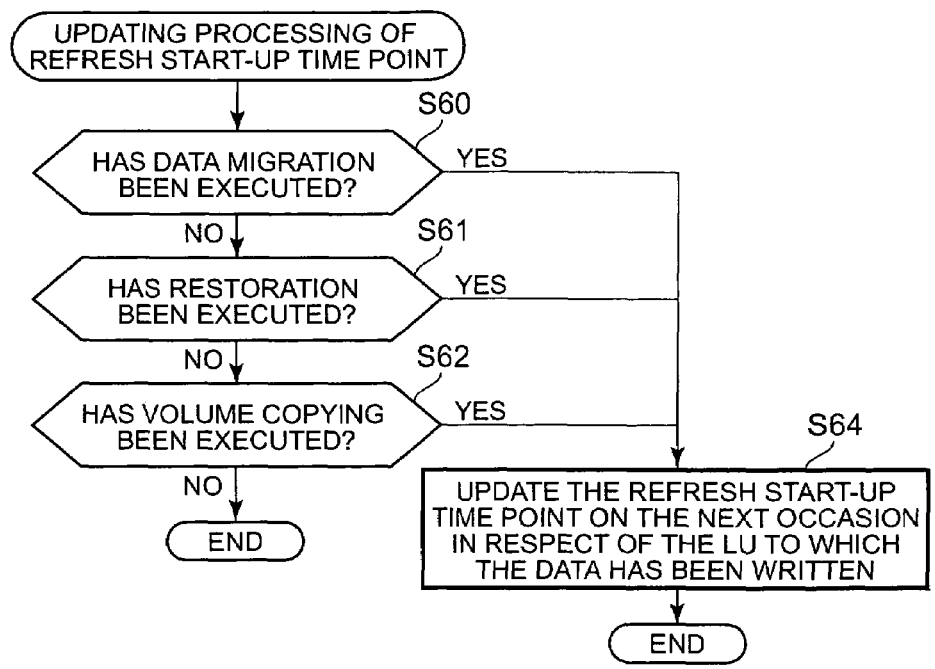
FIG. 22 is a flow chart showing processing whereby the refresh start-up time point is updated, that is executed by a storage system according to a fourth embodiment.

FIG. 22 is a flow chart showing the processing for updating the refreshing start-up time point. The management server 30 monitors for example whether or not data migration has been executed (S60), whether or not restoration has been executed (S61) and whether or not volume copying has been executed (S62). If it is detected that such prescribed processing has been executed (S60: YES, S61: YES, S62: YES), the management server 30 updates (S64) the refreshing start-up time point in respect of the logical device to which data was written by this prescribed processing.

For example, if refreshing is performed with a period of three years in respect of a given logical device 124, a time point that is three years after the time point where the prescribed processing was executed is set in the table MT1 as the next refreshing start-up time point. This embodiment constructed in this way has the same beneficial effect as the first embodiment.

Embodiment 5

A fifth embodiment is described with reference to FIG. 23. In this embodiment, the loading of the storage system is distributed by adjusting the refreshing start-up time point such that refresh processing is not duplicated a plurality of times.

Figure 23:
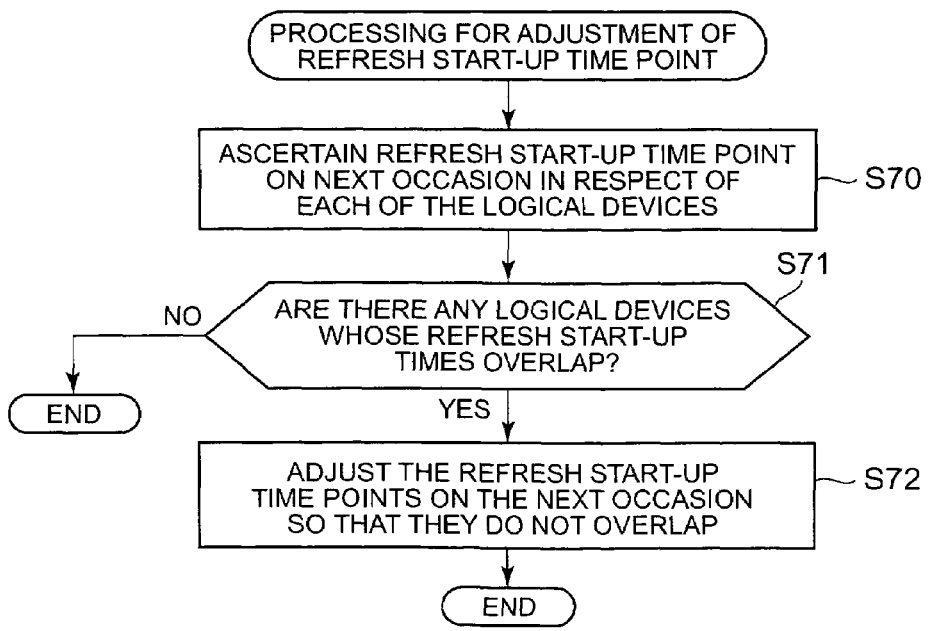
FIG. 23 is a flow chart showing processing for adjusting the refresh start-up time point that is executed by a storage system according to a fifth embodiment.

FIG. 23 is a flow chart showing the processing for adjusting the refreshing start-up time point. This processing is executed by the management server 30. The management server 30 confirms (S70) the refreshing start-up time point on the next occasion that is set in the logical devices 124 by referencing the table MT1.

The management server 30 ascertains (S71) whether or not logical devices 124 exist whose refreshing start-up time points overlap. Existence of overlapping refreshing start-up time points means that there is coincidence or partial overlap of the execution time of refresh processing in relation to one logical device 124 with the execution time of refresh processing relating to another logical device 124.

If there exist logical devices 124 with overlapping refreshing start-up time points (S71: YES), the management server 30 calculates new refreshing start-up time points such that the refreshing start-up time points do not overlap and sets these in the table MT1 (S72).

This embodiment constructed in this way has the same beneficial effects as the first embodiment. In addition, in this embodiment, the refreshing start-up time points are adjusted beforehand such that refreshing processing cannot be executed in a overlapping fashion, so the load required for refresh processing in the storage system can be dispersed.

Embodiment 6

A sixth embodiment is described with reference to FIG. 24 to FIG. 26. In this embodiment, data stored on a logical device 124 is refreshed by switch apparatus 40 that connects a host 20 and storage apparatus 10.

Figure 24:
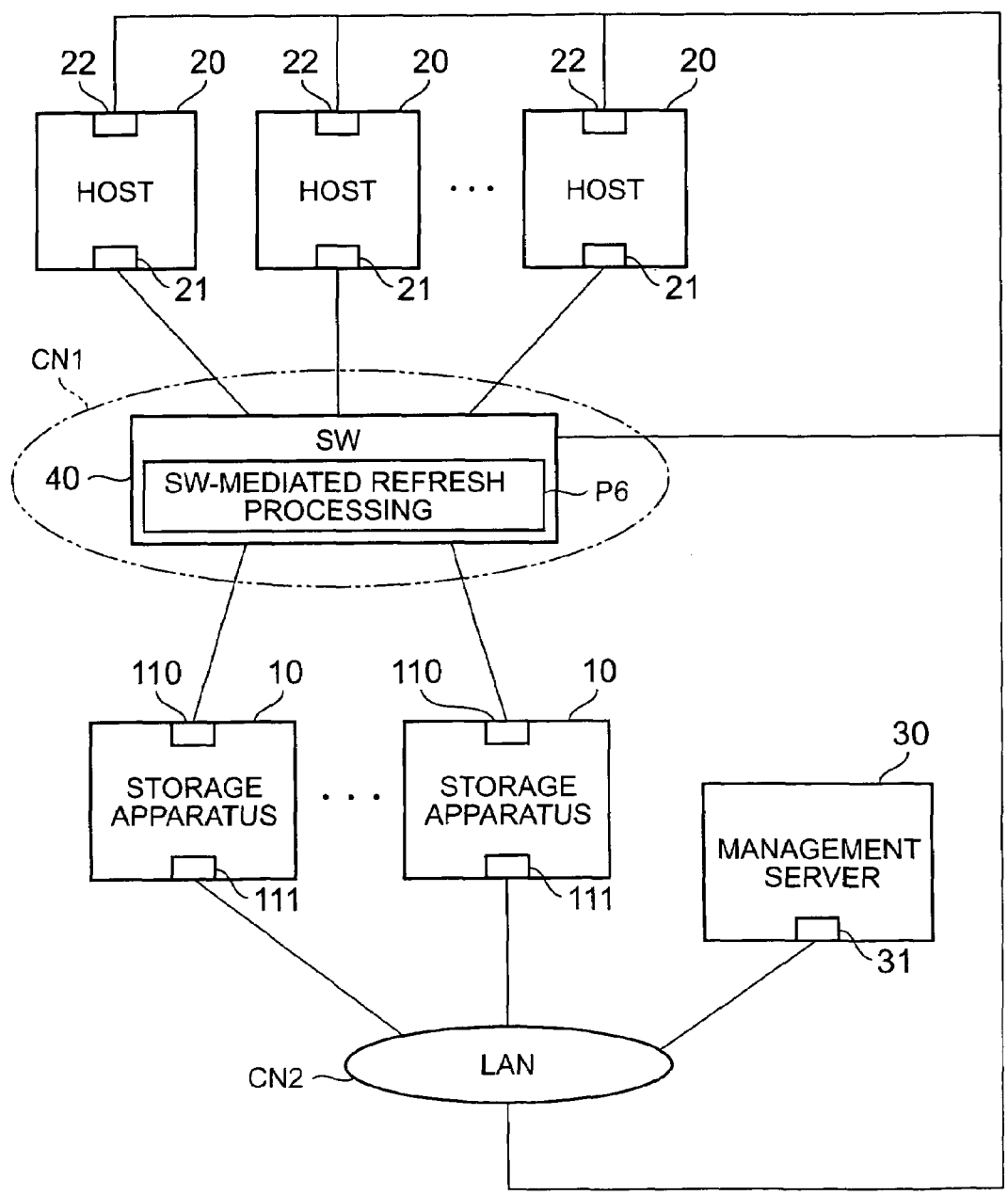
FIG. 24 is a flow chart showing the overall construction of a storage system according to a sixth embodiment.

FIG. 24 shows the overall construction of a storage system according to this embodiment. Switch apparatus 40 is provided between the storage apparatus 10 and host 20. The switch apparatus 40 is capable of executing switch-mediated refresh processing P6.

Figure 25:
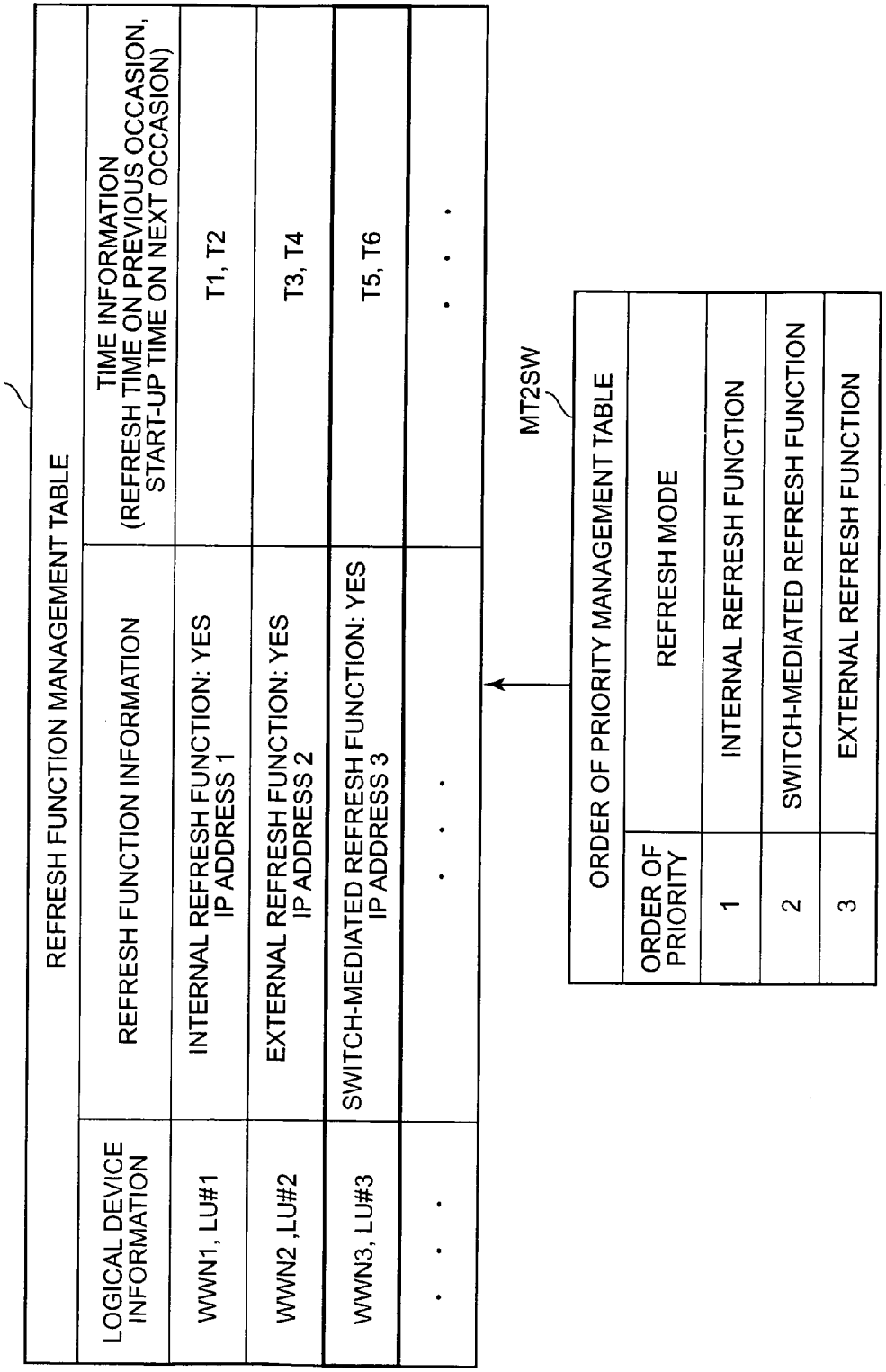
FIG. 25 is a diagram showing a refresh function management table and a priority order management table.

FIG. 25 shows a refresh function management table MT1SW. In this table MT1SW, a switch-mediated refresh function (switch-mediated refresh processing P6) can be selected as a value of the refresh function information. If a switch-mediated refresh function is selected, the IP address of the switch apparatus 40 is set as the IP address.

Also, as shown in the order of priority management table MT1SW, in this embodiment, orders of priority are set in the order: (1) internal refresh function, (2) switch-mediated refresh function and (3) external refresh function.

Figure 26:
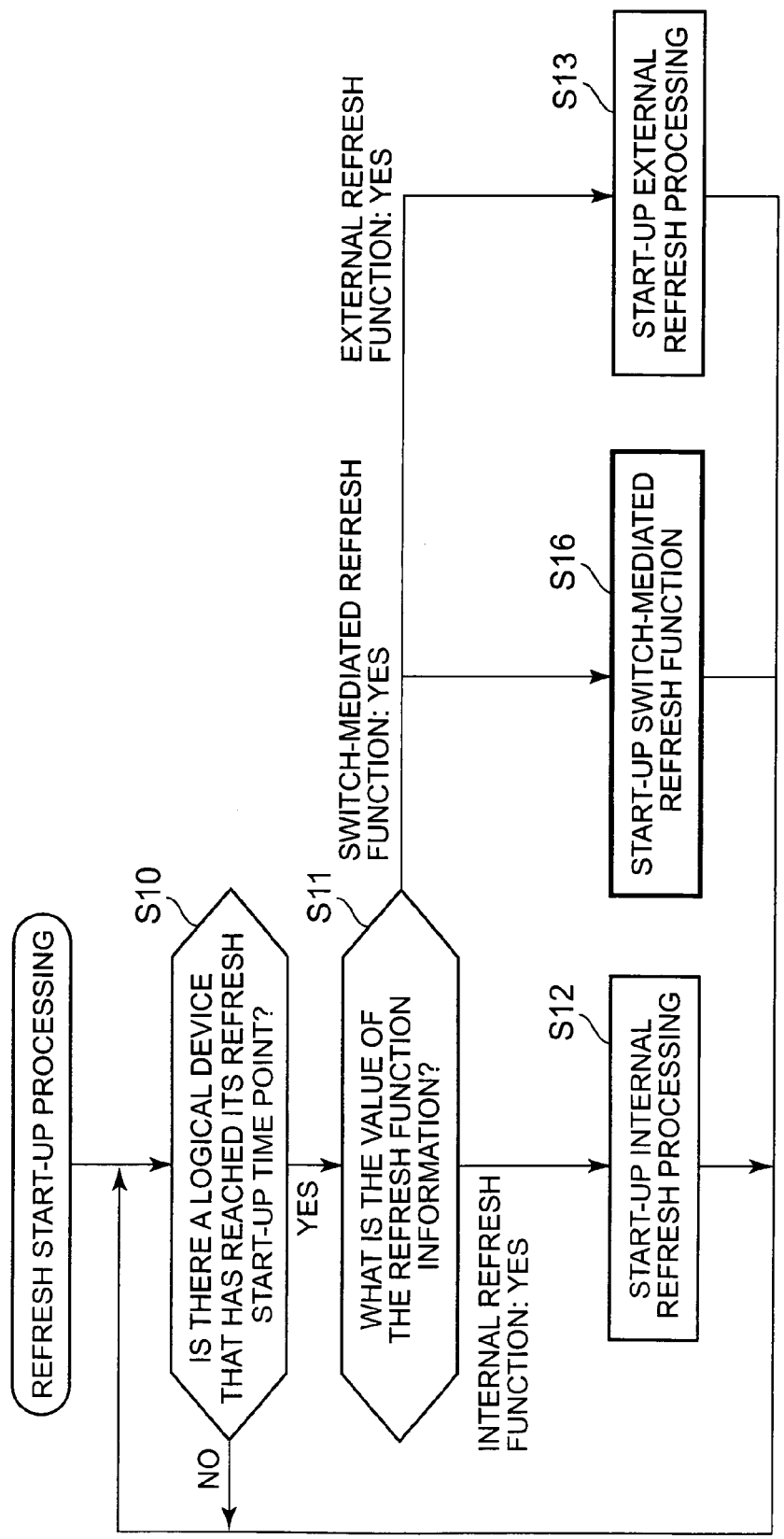
FIG. 26 is flow chart showing refresh start-up processing.

FIG. 26 is a flow chart showing refreshing start-up processing. In this processing, as shown in S16, if "switch-mediated refresh function" is set in the refresh function information, the management server 30 sends a start-up command to the switch apparatus 40. The switch apparatus 40 then accesses the logical device 124 that is the subject of refreshing, reads all of the data stored thereon in fixed amounts, and writes back this data that has thus been read to its original storage position.

The embodiment constructed in this way has the same beneficial effects as the first embodiment. In addition, in this embodiment, since refreshing of the data in a logical device 124 can be effected in switch apparatus 40, even in the case where neither the storage apparatus 10 nor the host 20 is provided with a refresh function, all of the data in the logical device 124 can be refreshed, improving convenience of use.

Embodiment 7

Figure 27:
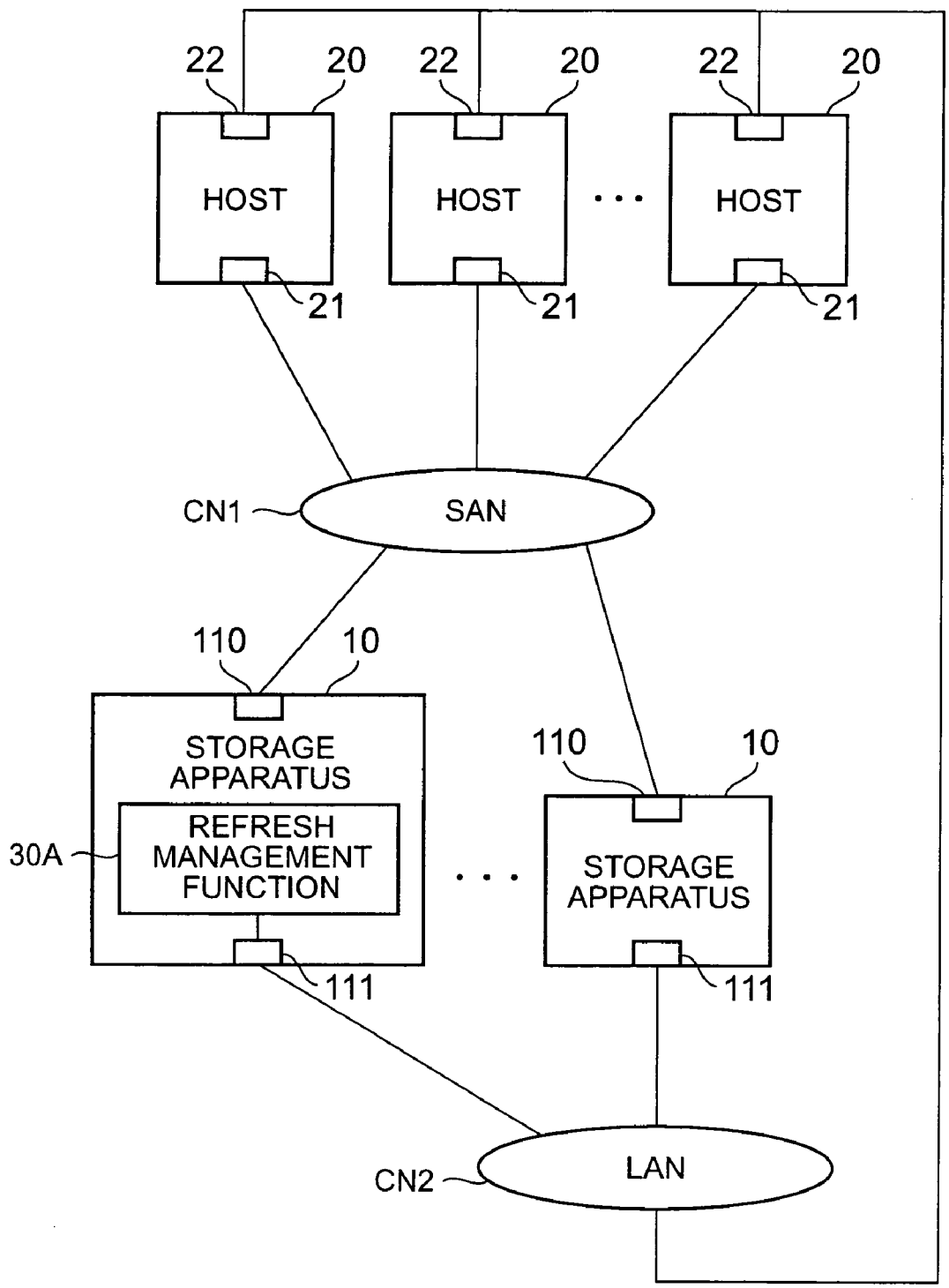
FIG. 27 is a diagram showing the overall construction of a storage system according to a seventh embodiment.

A seventh embodiment described with reference to FIG. 27. In this embodiment, the management server 30 is dispensed with and the functionality of the management server 30 is provided in the storage apparatus 10. FIG. 27 shows the overall construction of a storage system according to this embodiment. A refresh management function 30A may be provided in any one or a plurality of storage apparatuses 10. This refresh management function 30A implements the role that was performed by the management server 30 and comprises for example a table MT1 and refreshing start-up processing P1.

This embodiment constructed as above has the same beneficial effects as the first embodiment. In addition to this, with this embodiment, since a refresh management function 30A is provided in the storage apparatus 10, there is no need to provide a management server 30 Consequently, the area or space required for installation of the storage system can be reduced, making possible further reduction in total cost of ownership of the storage system.

Embodiment 8

Figure 28:
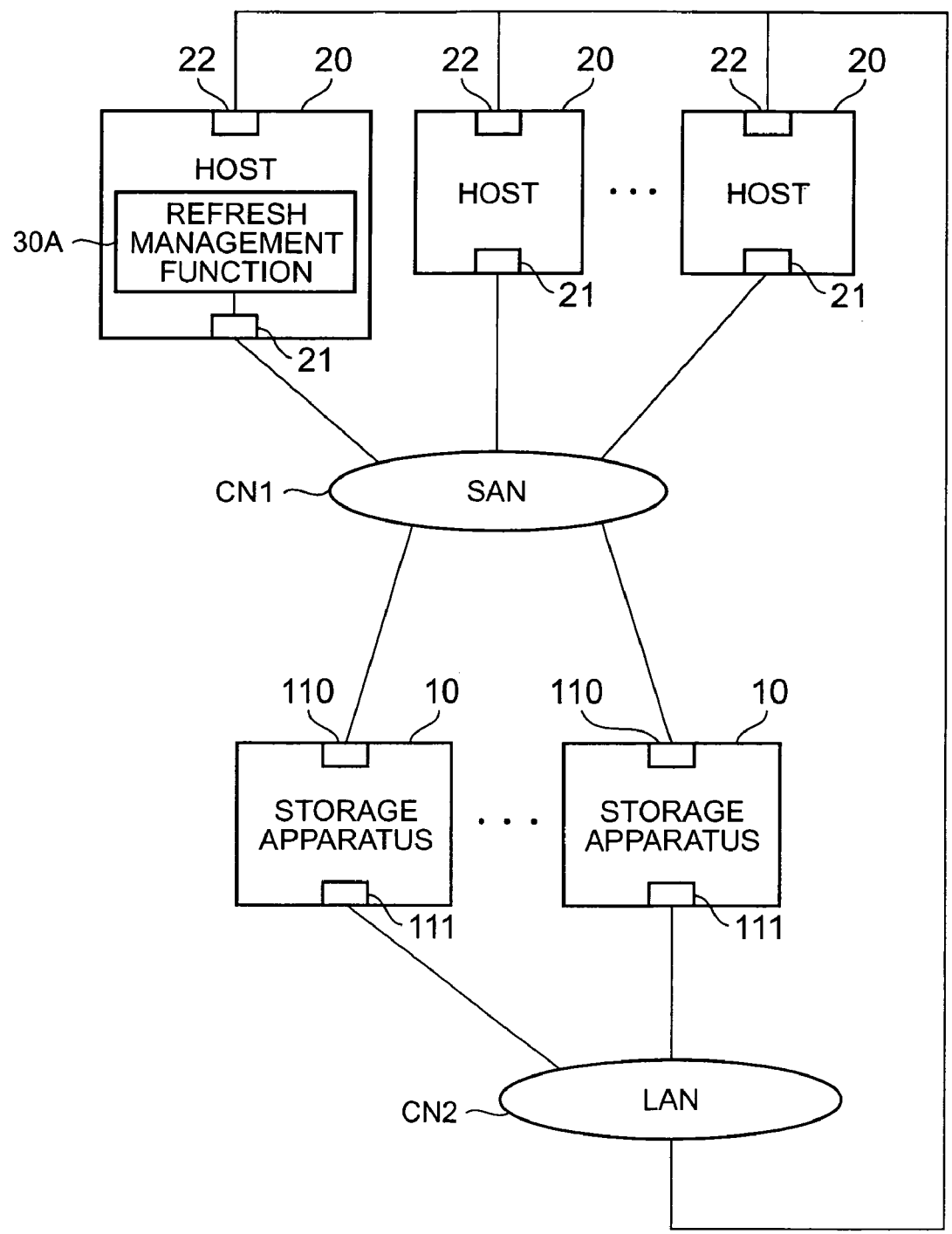
FIG. 28 is a diagram showing the overall construction of a storage system according to an eighth embodiment.

An eighth embodiment is described with reference to FIG. 28. In this embodiment, the management server 30 is dispensed with and the function of the management server 30 is provided in a host 20. FIG. 28 shows the overall construction of a storage system according to this embodiment. The refresh management function 30A referred to above is provided in any one or a plurality of hosts 20.

Since refresh processing of the data is managed by a host 20 in this embodiment constructed in this way, although there is a possibility of increase in load of the host 20 or some increase of traffic of the communication network CN1, substantially the same benefits as in the case of the seventh embodiment described above are presented.

It should be noted that the present invention is not restricted to the embodiments described above. A person skilled in the art may perform for example various additions or modifications within the scope of the present invention. For example, flash memory devices and hard disk drives may be mixed in the storage apparatus. Also, a construction may be adopted in which for example a plurality of logical devices are managed as a group and in which refresh processing is performed in group units.

Furthermore, for example a construction may be adopted in which a plurality of types of memory device of for example different technical properties/performance or reliability, such as NAND type flash memory devices and NOR type flash memory devices are mixed, and a refresh method or refresh time may be suitably set in accordance with the characteristics of these respective memory devices.

What is claimed is:

1. A storage system comprising:
    an external apparatus and a storage apparatus mutually connected through a first communication network; and
    a management apparatus respectively connected to the external apparatus and the storage apparatus through a second communication network separate from the first communication network, wherein
    the storage apparatus includes: a storage unit having rewritable nonvolatile memory devices; a controller that controls the storage unit; a plurality of logical devices based on storage regions possessed by the memory devices; and an internal refresh processing unit for performing refresh relating to the logical devices;
    the external apparatus includes: an external refresh processing unit for performing refresh relating to the logical devices through the storage apparatus; and
    the management apparatus includes: a management table that respectively manages beforehand, for each the logical device, the refresh time and information indicating which of the internal refresh processing or the external refresh processing is to be selected; and
    a starting up unit that issues to the storage apparatus or external apparatus a command for starting up refresh processing of the selected one of the internal refresh processing or the external refresh processing.

2. The storage system according to claim 1, wherein the external refresh processing unit performs an external refresh mode, the external apparatus reads all of the data stored in the prescribed logical device through the storage apparatus, and writes back all of the data that has been read to the prescribed logical device through the storage apparatus; and the internal refresh processing unit performs an internal refresh mode, within the storage apparatus, all of the data stored in the prescribed logical device is read and all of the data that is thus read is written back to the prescribed logical device.

3. The storage system according to claim 1, wherein the internal refresh processing unit performs a first internal refresh mode and a second internal refresh mode;

in the first internal refresh mode, the controller reads all of the data stored on the prescribed logical device, and writes back all of the data that has been read to the prescribed logical device; and in the second internal refresh mode, within the memory device all of the data stored in the prescribed storage region corresponding to the prescribed logical device, of storage regions of the memory device, is read and all of the data that is read is written back to the prescribed storage region.

4. The storage system according to claim 1, wherein the external refresh processing unit performs an external refresh mode, the internal refresh processing unit performs a first internal refresh mode, and a second internal refresh mode;

in the external refresh mode, the external apparatus reads all of the data stored in the prescribed logical device through the storage apparatus, and writes back all of the data that has been read to the prescribed logical device through the storage apparatus;

in the first internal refresh mode, the controller reads all of the data stored on the prescribed logical device, and writes back all of the data that has been read to the prescribed logical device; and in the second internal refresh mode, within the memory device all of the data stored in a prescribed storage region corresponding to the prescribed logical device, of storage regions of the memory device, is read, and all of the data that is thus read is written back to the prescribed storage region.

5. The storage system according to claim 1, wherein the storage apparatus, when the command is received from the management apparatus, determines whether refresh relating to the prescribed logical device is to be executed by the controller or whether refresh relating to the prescribed logical device is to be executed in the memory device.

6. The storage system according to claim 1, wherein an order of priority is set beforehand in respect of the plurality of types of refresh mode, and the management apparatus selects with priority a refresh mode of high order of priority.

7. The storage system according to claim 1, wherein the management apparatus, when both the external refresh mode and the internal refresh mode can be selected, selects with priority the internal refresh mode.

8. The storage system according to claim 1, wherein the management apparatus, when a plurality of the prescribed logical devices are present, performs adjustment such that the refresh times relating to the prescribed logical devices do not overlap.

9. The storage system according to claim 1, wherein the management apparatus alters the refresh time relating to the prescribed logical device if prescribed processing to write all of the data stored on the prescribed logical device to the memory device has been performed previously, prior to the arrival of the refresh time in respect of the prescribed logical device.

10. The storage system according to claim 1, wherein the storage apparatus is connected to the external apparatus through the communication network when the refresh time has arrived.

* * * * *